(12) United States Patent
Tsukamoto

(10) Patent No.: US 10,889,897 B2
(45) Date of Patent: Jan. 12, 2021

(54) METHOD FOR PRODUCING ELECTROCONDUCTIVE LAMINATE, THREE-DIMENSIONAL STRUCTURE WITH PLATED-LAYER PRECURSOR LAYER, THREE-DIMENSIONAL STRUCTURE WITH PATTERNED PLATED LAYER, ELECTROCONDUCTIVE LAMINATE, TOUCH SENSOR, HEAT GENERATING MEMBER, AND THREE-DIMENSIONAL STRUCTURE

(71) Applicant: FUJIFILM Corporation, Tokyo (JP)

(72) Inventor: Naoki Tsukamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 40 days.

(21) Appl. No.: 16/119,799

(22) Filed: Aug. 31, 2018

(65) Prior Publication Data

US 2018/0371619 A1 Dec. 27, 2018

Related U.S. Application Data

(63) Continuation of application No. PCT/JP2017/008648, filed on Mar. 6, 2017.

(30) Foreign Application Priority Data

Mar. 23, 2016 (JP) .................................. 2016-059125

(51) Int. Cl.
*B32B 3/00* (2006.01)
*C23C 18/18* (2006.01)
(Continued)

(52) U.S. Cl.
CPC .......... *C23C 18/1882* (2013.01); *B32B 15/04* (2013.01); *C23C 18/165* (2013.01);
(Continued)

(58) Field of Classification Search
None
See application file for complete search history.

(56) References Cited

U.S. PATENT DOCUMENTS

| 2007/0261595 | A1 | 11/2007 | Johnson et al. |
| 2009/0035559 | A1 | 2/2009 | Kitamura et al. |

(Continued)

FOREIGN PATENT DOCUMENTS

| CA | 980618 A | 12/1975 |
| JP | S53-43081 B | 11/1978 |

(Continued)

OTHER PUBLICATIONS

An Office Action; "Notice of Reasons for Refusal," issued by the Japanese Patent Office dated Jul. 2, 2019, which corresponds to Japanese Patent Application No. 2018-507180 and is related to U.S. Appl. No. 16/119,799; with English Translation.

(Continued)

*Primary Examiner* — Seth Dumbris
(74) *Attorney, Agent, or Firm* — Studebaker & Brackett PC

(57) ABSTRACT

An object of the present invention is to provide a method for easily producing an electroconductive laminate having a three-dimensional shape and having a metal layer disposed thereon (for example, an electroconductive laminate having a three-dimensional shape including a curved surface and a metal layer disposed on the curved surface). Another object of the present invention is to provide a three-dimensional structure with a plated-layer precursor layer, a three-dimensional structure with a patterned plated layer, an electroconductive laminate, a touch sensor, a heat generating member, and a three-dimensional structure.
The method for producing an electroconductive laminate of the present invention has a step of obtaining a three-dimensional structure with a plated-layer precursor layer (Continued)

including a three-dimensional structure and a plated-layer precursor layer disposed on the three-dimensional structure and having a functional group capable of interacting with a plating catalyst or a precursor thereof and a polymerizable group; a step of applying energy to the plated-layer precursor layer to form a patterned plated layer; and a step of subjecting the patterned plated layer to a plating treatment to form a patterned metal layer on the plated layer.

12 Claims, 7 Drawing Sheets

(51) Int. Cl.

| | |
|---|---|
| C25D 5/56 | (2006.01) |
| B32B 15/04 | (2006.01) |
| C23C 18/16 | (2006.01) |
| C23C 18/20 | (2006.01) |
| H05K 3/18 | (2006.01) |
| H05K 3/10 | (2006.01) |
| H05K 1/11 | (2006.01) |
| C23C 18/38 | (2006.01) |
| G06F 3/044 | (2006.01) |
| H05K 3/06 | (2006.01) |
| H05K 3/46 | (2006.01) |
| C23C 18/30 | (2006.01) |
| H05K 1/02 | (2006.01) |

(52) U.S. Cl.
CPC ...... *C23C 18/1608* (2013.01); *C23C 18/1612* (2013.01); *C23C 18/1893* (2013.01); *C23C 18/2086* (2013.01); *C23C 18/38* (2013.01); *C25D 5/56* (2013.01); *G06F 3/044* (2013.01); *H05K 1/119* (2013.01); *H05K 3/06* (2013.01); *H05K 3/106* (2013.01); *H05K 3/182* (2013.01); *H05K 3/4644* (2013.01); *C23C 18/30* (2013.01); *G06F 2203/04103* (2013.01); *H05K 1/0284* (2013.01); *H05K 1/0287* (2013.01); *Y10T 428/24917* (2015.01)

(56) References Cited

U.S. PATENT DOCUMENTS

| | | |
|---|---|---|
| 2009/0269599 A1 | 10/2009 | Tsurumi |
| 2010/0080893 A1 | 4/2010 | Inoue et al. |
| 2010/0080964 A1 | 4/2010 | Kano et al. |
| 2010/0167081 A1* | 7/2010 | Kim ............... C23C 18/1608 428/600 |
| 2011/0089160 A1* | 4/2011 | Kuriki ............... G06F 3/044 219/553 |
| 2011/0104454 A1* | 5/2011 | Kawano ............ G03F 7/0388 428/195.1 |
| 2011/0151215 A1* | 6/2011 | Kobayashi ............ B32B 7/02 428/212 |
| 2013/0050331 A1 | 2/2013 | Kaeriyama et al. |
| 2013/0050365 A1 | 2/2013 | Irita |
| 2017/0135222 A1 | 5/2017 | Kito et al. |

FOREIGN PATENT DOCUMENTS

| | | |
|---|---|---|
| JP | H3-288491 A | 12/1991 |
| JP | 2006-135271 A | 5/2006 |
| JP | 2008-516039 A | 5/2008 |
| JP | 2008-308762 A | 12/2008 |
| JP | 2009-007540 A | 1/2009 |
| JP | 2009-245748 A | 10/2009 |
| JP | 2009-280905 A | 12/2009 |
| JP | 2010-084196 A | 4/2010 |
| JP | 2010-530441 A | 9/2010 |
| JP | 2011-94192 A | 5/2011 |
| JP | 2011-096947 A | 5/2011 |
| JP | 2013-043945 A | 3/2013 |
| JP | 2013-043946 A | 3/2013 |
| JP | 2013-125820 A | 6/2013 |
| JP | 2013-246741 A | 12/2013 |
| JP | 2015-115393 A | 6/2015 |
| JP | 2016-029209 A | 3/2016 |

OTHER PUBLICATIONS

An Office Action mailed by the Korean Patent Office dated Nov. 7, 2019, which corresponds to Korean Patent Application No. 10-2018-7026383 and is related to U.S. Appl. No. 16/119,799.
An Office Action mailed by the Japanese Patent Office dated Dec. 10, 2019, which corresponds to Japanese Patent Application No. 2018-507180 and is related to U.S. Appl. No. 16/119,799.
International Search Report issued in PCT/JP2017/008648; dated May 30, 2017.
Written Opinion issued in PCT/JP2017/008648; dated May 30, 2017.
An Office Action issued by the China National Intellectual Property Administration dated Sep. 3, 2020, which corresponds to Chinese Patent Application No. 201780016646.0 and is related to U.S. Appl. No. 16/119,799 with English language translation.

* cited by examiner

METHOD FOR PRODUCING ELECTROCONDUCTIVE LAMINATE, THREE-DIMENSIONAL STRUCTURE WITH PLATED-LAYER PRECURSOR LAYER, THREE-DIMENSIONAL STRUCTURE WITH PATTERNED PLATED LAYER, ELECTROCONDUCTIVE LAMINATE, TOUCH SENSOR, HEAT GENERATING MEMBER, AND THREE-DIMENSIONAL STRUCTURE

CROSS-REFERENCE TO RELATED APPLICATIONS

This application is a Continuation of PCT International Application No. PCT/JP2017/008648 filed on Mar. 6, 2017, which claims priority under 35 U.S.C. § 119(a) to Japanese Patent Application No. 2016-059125 filed on Mar. 23, 2016. The above application is hereby expressly incorporated by reference, in its entirety, into the present application.

BACKGROUND OF THE INVENTION

1. Field of the Invention

The present invention relates to a method for producing an electroconductive laminate, a three-dimensional structure with a plated-layer precursor layer, a three-dimensional structure with a patterned plated layer, an electroconductive laminate, a touch sensor, a heat generating member, and a three-dimensional structure.

2. Description of the Related Art

An electroconductive laminate having a conductive film (electroconductive thin wire) formed on a substrate has been used for various purposes. Particularly, in recent years, along with an increase in the rate at which a touch panel or a touch pad has been mounted on mobile phones and portable game devices, a demand for an electroconductive laminate for an electrostatic capacitance touch sensor capable of carrying out multi-point detection has been rapidly increasing.

Meanwhile, with the recent spread of touch panels and touch pads, the types of devices in which such touch panels and touch pads are mounted are diversified, and in order to further enhance the operability of the devices, touch panels and touch pads with curved touch surfaces have been proposed.

For example, JP2013-246741A discloses an "electrostatic capacitance touch panel having a touch surface of a three-dimensional curved surface shape, which is made of a laminate including at least a transparent substrate sheet and a main electrode layer having a plurality of main electrode regions formed on one surface of the substrate sheet using an electroconductive ink having a dry coating film elongation percentage of 10% or less and a visible light transmittance of 90% or more, in which the laminate becomes a molded article including a three-dimensional curved surface by drawing after heating and softening".

More specifically, in the method of producing a three-dimensional curved surface touch panel disclosed in JP2013-246741A, first, a surface of a transparent substrate sheet is provided with a main electrode layer having a plurality of main electrode regions formed using an electroconductive ink containing an organic electroconductive material. Subsequently, an auxiliary electrode layer having an auxiliary electrode region is provided at a place to become a peripheral portion in the three-dimensional curved surface by drawing on the main electrode layer. Thereafter, the three-layered laminate is molded into a three-dimensional curved surface by drawing in a state of being heated and softened, and the resultant is cooled or allowed to cool to obtain a curved molded article.

SUMMARY OF THE INVENTION

However, an electroconductive ink layer (a conductive layer) formed from an electroconductive ink containing an organic electroconductive material such as a carbon nanotube or poly(3,4-ethylenedioxythiophene) (PEDOT) used in the production method of JP2013-246741A has a problem from an industrial point of view due to a tendency that the resistance value further increases since the original organic material has a relatively high resistance value of 50Ω/□ or more, and the conductive layer is stretched at the time of deformation.

Meanwhile, the metal layer made of a metal has a resistance value of 1Ω/□ or less even with a mesh shape with an opening ratio of 90% or more, which is lower than that of the organic electroconductive material, and exhibits excellent conductive characteristics.

On the other hand, in the case of attempting to impart a three-dimensional shape by drawing, for example, as in the method of JP2013-246741A, using an electroconductive film having a metal layer formed on a resin substrate by metal plating treatment, metal vapor deposition, or the like, the metal layer fails to follow the elongation of the resin substrate and breaks in many cases.

The present invention has been made in view of the above circumstances, and an object of the present invention is to provide a method for easily producing an electroconductive laminate having a three-dimensional shape and including a metal layer (for example, an electroconductive laminate having a three-dimensional shape including a curved surface and a metal layer disposed on the curved surface).

Another object of the present invention is to provide a three-dimensional structure with a plated-layer precursor layer, a three-dimensional structure with a patterned plated layer, an electroconductive laminate, a touch sensor, a heat generating member, and a three-dimensional structure.

As a result of extensive studies on the foregoing objects, the present inventors have found that the foregoing objects can be achieved by carrying out a plating treatment after forming a patterned plated layer on a three-dimensional structure (for example, a three-dimensional substrate having a three-dimensional shape including a curved surface).

That is, the present inventors have found that the foregoing objects can be achieved by the following configurations.

(1) A method for producing an electroconductive laminate, comprising:

a step of obtaining a three-dimensional structure with a plated-layer precursor layer including a three-dimensional structure and a plated-layer precursor layer disposed on the three-dimensional structure and having a functional group capable of interacting with a plating catalyst or a precursor thereof and a polymerizable group;

a step of applying energy to the plated-layer precursor layer to form a patterned plated layer; and a step of subjecting the patterned plated layer to a plating treatment to form a patterned metal layer on the plated layer.

(2) The method for producing an electroconductive laminate according to (1), in which the step of forming the patterned plated layer has an exposing step of exposing the plated-layer precursor layer in a patternwise manner through a photo mask having a three-dimensional shape corresponding to a surface shape of the plated-layer precursor layer disposed on the three-dimensional structure and having an opening portion, and a developing step of developing the plated-layer precursor layer after exposure.

(3) The method for producing an electroconductive laminate according to (2), in which the transmittance of the three-dimensional structure at a wavelength of 400 nm is 80% or more, the plated-layer precursor layer further includes a polymerization initiator, and the absorption edge on the long wavelength side of the ultraviolet-visible absorption spectrum of the polymerization initiator is located on a shorter wavelength side than the absorption edge on the long wavelength side of the ultraviolet-visible absorption spectrum of the three-dimensional structure, and in which the exposing step is a step of radiating light having a wavelength on a shorter wavelength side than the absorption edge on the long wavelength side of the ultraviolet-visible absorption spectrum of the three-dimensional structure, and having a wavelength at which the polymerization initiator is sensitized in a patternwise manner.

(4) The method for producing an electroconductive laminate according to any one of (1) to (3), in which the step of obtaining a three-dimensional structure with a plated-layer precursor layer has a step of applying a composition containing a polymerization initiator and Compound X or Composition Y given below onto the three-dimensional structure by a dip coating method.

Compound X: a compound having a functional group capable of interacting with a plating catalyst or a precursor thereof, and a polymerizable group Composition Y: a composition containing a compound having a functional group capable of interacting with a plating catalyst or a precursor thereof, and a compound having a polymerizable group (5) The method for producing an electroconductive laminate according to any one of (1) to (3), in which the step of obtaining a three-dimensional structure with a plated-layer precursor layer has a step of applying a composition containing a polymerization initiator and Compound X or Composition Y given below onto the three-dimensional structure by a spray coating method.

Compound X: a compound having a functional group capable of interacting with a plating catalyst or a precursor thereof, and a polymerizable group Composition Y: a composition containing a compound having a functional group capable of interacting with a plating catalyst or a precursor thereof, and a compound having a polymerizable group (6) A three-dimensional structure with a plated-layer precursor layer, comprising:

a three-dimensional structure; and a plated-layer precursor layer disposed on the three-dimensional structure and having a functional group capable of interacting with a plating catalyst or a precursor thereof and a polymerizable group.

(7) The three-dimensional structure with a plated-layer precursor layer according to (6), in which the plated-layer precursor layer includes a polymerization initiator and Compound X or Composition Y given below.

Compound X: a compound having a functional group capable of interacting with a plating catalyst or a precursor thereof, and a polymerizable group Composition Y: a composition containing a compound having a functional group capable of interacting with a plating catalyst or a precursor thereof, and a compound having a polymerizable group (8) The three-dimensional structure with a plated-layer precursor layer according to (7), in which the transmittance of the three-dimensional structure at a wavelength of 400 nm is 80% or more, and the absorption edge on the long wavelength side of the ultraviolet-visible absorption spectrum of the polymerization initiator contained in the plated-layer precursor layer is located on a shorter wavelength side than the absorption edge on the long wavelength side of the ultraviolet-visible absorption spectrum of the three-dimensional structure.

(9) A three-dimensional structure with a patterned plated layer, comprising:

a three-dimensional structure; and a patterned plated layer disposed on the three-dimensional structure.

(10) The three-dimensional structure with a patterned plated layer according to (9), in which the patterned plated layer is a layer obtained by curing a composition containing a polymerization initiator and Compound X or Composition Y given below.

Compound X: a compound having a functional group capable of interacting with a plating catalyst or a precursor thereof, and a polymerizable group Composition Y: a composition containing a compound having a functional group capable of interacting with a plating catalyst or a precursor thereof, and a compound having a polymerizable group

(11) The three-dimensional structure with a patterned plated layer according to (9) or (10), in which the region where the patterned plated layer is formed is 50 area % or less with respect to the total surface area of the three-dimensional structure.

(12) The three-dimensional structure with a patterned plated layer according to any one of (9) to (11), in which the patterned plated layer further includes a plating catalyst or a precursor thereof.

(13) The three-dimensional structure with a patterned plated layer according to any one of (9) to (12), in which the patterned plated layer has a region in which a line width of the pattern is 20 µm or less.

(14) An electroconductive laminate comprising:

the three-dimensional structure with a patterned plated layer according to any one of (9) to (13); and a metal layer disposed on the patterned plated layer.

(15) A touch sensor comprising:

the electroconductive laminate according to (14), in which the metal layer functions as an electrode or wiring.

(16) A heat generating member comprising:

the electroconductive laminate according to (14), in which the metal layer functions as a heating wire.

(17) A three-dimensional structure used for forming a patterned plated layer and containing an ultraviolet absorber.

According to the present invention, it is possible to provide a method for easily producing an electroconductive laminate having a three-dimensional shape and including a metal layer (for example, an electroconductive laminate having a three-dimensional shape including a curved surface and a metal layer disposed on the curved surface).

Further, according to the present invention, it is possible to provide a three-dimensional structure with a plated-layer precursor layer, a three-dimensional structure with a patterned plated layer, an electroconductive laminate, a touch sensor, a heat generating member, and a three-dimensional structure.

DESCRIPTION OF THE PREFERRED EMBODIMENTS

Figure 1:
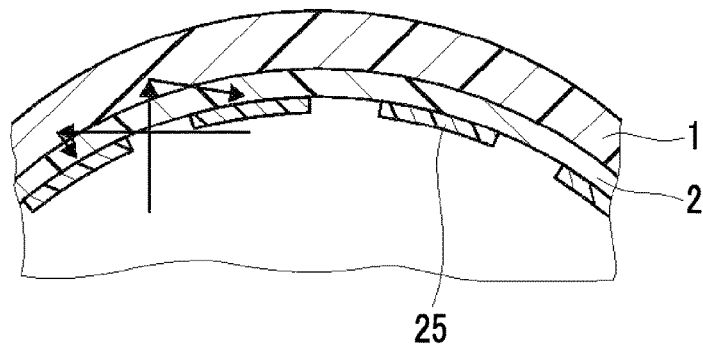
FIG. 1 is a view for explaining sensitization in an unexposed part due to light reflection in the case where a patterned plated layer is formed by exposure.

Hereinafter, the method for producing an electroconductive laminate of the present invention will be described in detail.

In the present specification, the numerical range expressed using "to" means a range including numerical values described before and after "to" as a lower limit value and an upper limit value, respectively. In addition, the drawings in the present invention are schematic diagrams for facilitating understanding of the invention, and the relationship of the thicknesses of each layer, the positional relationship of each layer, or the like does not necessarily match the actual ones.

[Method for Producing Electroconductive Laminate]

The method for producing an electroconductive laminate of the present invention has the following steps:

Step 1: a step of obtaining a three-dimensional structure with a plated-layer precursor layer including a three-dimensional structure and a plated-layer precursor layer disposed on the three-dimensional structure and having a functional group capable of interacting with a plating catalyst or a precursor thereof and a polymerizable group;

Step 2: a step of applying energy to the plated-layer precursor layer to form a patterned plated layer; and Step 3: a step of subjecting the patterned plated layer to a plating treatment to form a patterned metal layer on the plated layer.

Hereinafter, the configuration of the present invention will be described in detail.

One of the features of the method for producing an electroconductive laminate of the present invention is that energy is applied to a plated-layer precursor layer having a functional group capable of interacting with a plating catalyst or a precursor thereof and a polymerizable group to provide a patterned plated layer on a three-dimensional structure (for example, a three-dimensional substrate with three-dimensional shape including a curved surface), and a plating treatment is carried out to form a patterned metal layer.

Generally, a metal layer formed by metal plating treatment, metal vapor deposition, or the like exhibits excellent conductive characteristics, but has a small fracture elongation as compared with an organic electroconductive material. Therefore, in the case where a substrate is deformed in order to impart a three-dimensional shape after the metal layer is provided on the substrate, the metal layer fails to follow the elongation of the substrate and often breaks. Even in the case where the metal layer does not break, the metal layer follows the substrate and stretches at the time of deformation, so that the film thickness tends to be thin and the resistance value tends to be high.

Further, depending on the shape of the molded article, the thickness of the metal layer becomes nonuniform due to uneven elongation at the time of deformation, so there is a problem that variations tend to occur in resistance values (for example, in the case of forming a hemispherical molded article, as the amount of elongation of the metal layer becomes larger as approaching the center of curvature, thickness variation tends to occur, and the resistance value varies between the metal layers).

As described above, the method for producing an electroconductive laminate of the present invention forms a patterned plated layer on a three-dimensional structure already having a three-dimensional shape. By the plating treatment, a metal layer is formed on the patterned plated layer which is a layer of receiving (attached body of) a plating catalyst or a precursor thereof, whereby a desired metal wiring pattern can be formed. That is, the shape of the pattern constituted by the patterned plated layer is substantially the same as the shape of the pattern of the desired metal layer.

That is, according to the present invention, since there is no step of deforming the metal layer, it is possible to produce an electroconductive laminate having a three-dimensional shape which has a low resistance value and in which variations in the resistance value are suppressed.

Further, regarding the method for producing an electroconductive laminate of the present invention, in the step of forming the patterned plated layer, it is preferable to control the light absorption characteristics of the polymerization initiator and the three-dimensional structure contained in the plated-layer precursor layer, and the wavelength of the light to be irradiated.

The method for producing an electroconductive laminate of the present invention has a step of forming a patterned plated layer on a three-dimensional structure already having a three-dimensional shape. The patterned plated layer is formed by exposing (for example, an ultraviolet (UV) exposure machine (wavelength: 365 nm) as a light irradiation source) the plated-layer precursor layer formed on the three-dimensional structure through a photo mask and then removing the unexposed part (uncured portion) by development. As the photo mask, it is preferable to use a photo mask having a three-dimensional shape corresponding to the surface shape of the plated-layer precursor layer disposed on the three-dimensional structure and having an opening portion. Since the plated-layer precursor layer is a thin film, the shape of the plated-layer precursor layer disposed on the three-dimensional structure is substantially the same as the shape of the three-dimensional structure serving as the underlayer. Therefore, the photo mask has substantially the same shape as the three-dimensional structure and has an opening portion at a predetermined position.

The present inventors have found that, for example, in the case where a plated-layer precursor layer 2 is formed on a hemispherical three-dimensional structure 1 as shown in FIG. 1 and this plated-layer precursor layer 2 is exposed through a photo mask 25, in particular, in the region where the curvature is large, the pattern width of the plated layer to be obtained becomes larger than the predetermined value. It is conceived that the reason for this is that light is likely to be reflected on the surface of the three-dimensional structure particularly in a region where the curvature is large during exposure, and a part of the reflected light would also be exposed to a region where the plated-layer precursor layer is not desired to be sensitized (hereinafter, also referred to as "unexposed part") (see FIG. 1).

On the other hand, as described above, the present inventors have found a method to solve the above-mentioned problems by controlling the light absorption characteristics of the polymerization initiator (hereinafter, referred to as "polymerization initiator A") and the three-dimensional structure contained in the plated-layer precursor layer, and the wavelength of the light to be irradiated. Hereinafter, suitable aspects of the present invention which solve the above-mentioned problems will be described in detail.

Figure 2:
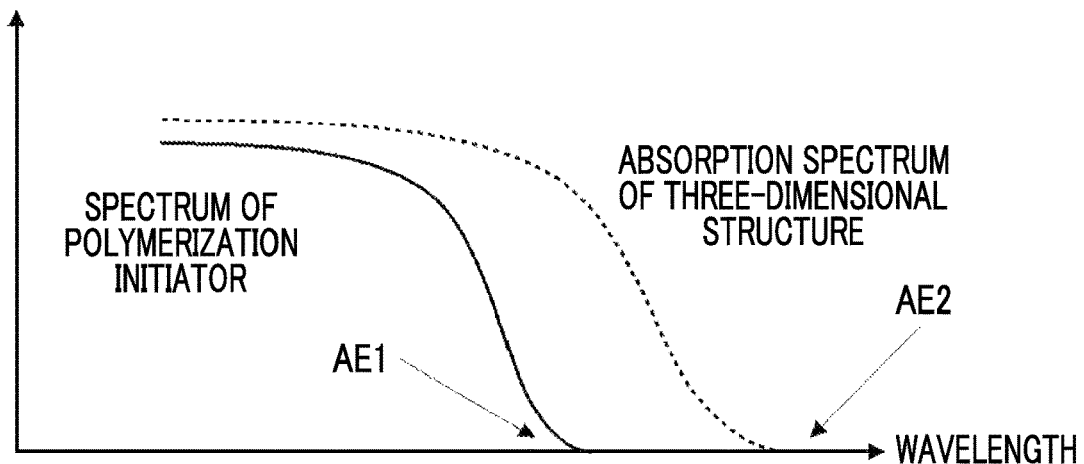
FIG. 2 is a graph showing a relationship between ultraviolet-visible absorption spectra of a polymerization initiator and a substrate, which is a suitable aspect of a method for producing an electroconductive laminate of the present invention.

As a characteristic feature of the suitable aspects, the point where the absorption edge on the long wavelength side of the ultraviolet-visible absorption spectrum of the polymerization initiator A is located on the shorter wavelength side than the absorption edge on the long wavelength side of the ultraviolet-visible absorption spectrum of the three-dimensional structure can be mentioned. FIG. 2 shows the relationship between the ultraviolet-visible absorption spectra of the polymerization initiator A and the three-dimensional structure. As shown in FIG. 2, the absorption edge AE1 on the long wavelength side of the ultraviolet-visible absorption spectrum of the polymerization initiator A is located on the shorter wavelength side than the absorption edge AE2 on the long wavelength side of the ultraviolet-visible absorption spectrum of the three-dimensional structure. That is, the absorption wavelength range of the polymerization initiator A overlaps the absorption wavelength range of the three-dimensional structure. Therefore, in such an aspect, as shown in FIG. 2, in the case where the plated-layer precursor layer disposed on the three-dimensional structure is irradiated with light at which the polymerization initiator A is sensitized (that is, it is light of a wavelength shorter than the absorption edge AE2 of the three-dimensional structure and at which the polymerization initiator A is sensitized, in other words, light of a wavelength shorter than the absorption edge AE1 of the polymerization initiator A), it is possible to suppress reflected light generated in the three-dimensional structure, and it is possible to suppress exposure in the unexposed part due to this.

Hereinafter, the method for producing an electroconductive laminate of the present invention will be described in detail. In addition to the explanation of the method for producing an electroconductive laminate of the present invention, the three-dimensional structure with a plated-layer precursor layer, the three-dimensional structure with a patterned plated layer, and the electroconductive laminate will also be described in detail.

It should be noted that the description of the constituent features described below may be made based on representative embodiments of the present invention, but the present invention is not limited to such embodiments.

First Embodiment

The first embodiment of the method for producing an electroconductive laminate has a step of obtaining a three-dimensional substrate with a plated-layer precursor layer having a three-dimensional substrate having a three-dimensional shape including a curved surface and a plated-layer precursor layer disposed on the three-dimensional substrate (step 1: a step of obtaining a three-dimensional substrate with a plated-layer precursor layer), a step of subjecting the plated-layer precursor layer to patternwise exposure through irradiation of light having a wavelength shorter than the absorption edge on the long wavelength side of the ultraviolet-visible absorption spectrum of the three-dimensional substrate and at which the polymerization initiator is sensitized to cure an exposed portion, thereby forming a patterned plated layer (step 2: a step of obtaining a three-dimensional substrate with a patterned plated layer), and a step of subjecting the patterned plated layer to a plating treatment to form a patterned metal layer on the patterned plated layer (step 3: metal layer forming step (electroconductive laminate forming step)).

In the first embodiment, the absorption edge on the long wavelength side of the ultraviolet-visible absorption spectrum of the polymerization initiator contained in the plated-layer precursor layer is on the shorter wavelength side than the absorption edge on the long wavelength side of the ultraviolet-visible absorption spectrum of the three-dimensional substrate. This relationship corresponds to the relationship explained in FIG. 2.

Figure 3:
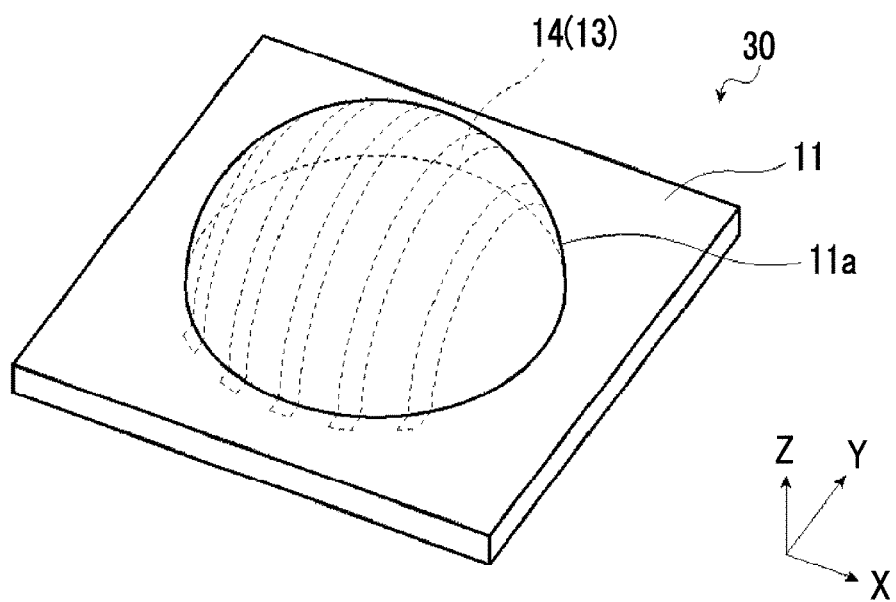
FIG. 3 is a perspective view of an electroconductive laminate 30 shown as a first embodiment.
Figure 4:
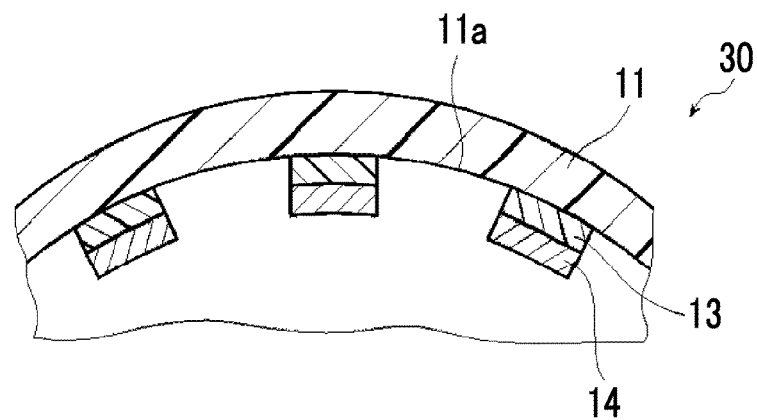
FIG. 4 is a partially enlarged view of an electroconductive laminate 30 shown as a first embodiment.

FIG. 3 is a perspective view schematically showing an electroconductive laminate 30 formed according to a first embodiment of a method for producing an electroconductive laminate of the present invention, and FIG. 4 is a partial cross-sectional view thereof. The electroconductive laminate 30 includes a three-dimensional substrate 11 having a three-dimensional shape including a curved surface, a patterned plated layer 13 disposed on a surface 11a of a region having a three-dimensional shape including a curved surface of the three-dimensional substrate 11, and a patterned metal layer 14 disposed on the patterned plated layer 13. In the electroconductive laminate 30, the metal layer 14 is a layer extending in a first direction (Y direction) and arranged at a predetermined interval in a second direction (X direction) orthogonal to the first direction.

In the electroconductive laminate 30 shown in FIG. 3, the metal layer 14 is disposed only on one surface of the three-dimensional substrate 11, but the metal layer 14 may be disposed on the other surface of the three-dimensional substrate 11. Alternatively, the metal layer 14 may be disposed on both surfaces of the three-dimensional substrate 11.

In the first embodiment, an embodiment using a three-dimensional substrate having a three-dimensional shape including a curved surface has been described as an example of the three-dimensional structure, but a three-dimensional structure in the present invention is of course not limited to this structure. As the three-dimensional structure in the present invention, for example, a substrate having a three-dimensional shape as shown in FIGS. 3 and 4 may be used, or a prism or ball (spherical) structure or the like may be used. As the three-dimensional structure in the present invention, a three-dimensional substrate having a three-dimensional shape is preferable, and a three-dimensional substrate having a three-dimensional shape including a curved surface is more preferable.

The transmittance (%) of the three-dimensional structure in the present invention and the position of the absorption edge on the long wavelength side of the ultraviolet-visible absorption spectrum thereof have the same definition as the range of each parameter of the three-dimensional substrate described in the first embodiment. The materials of the three-dimensional structure have the same definition as the various materials described in the first embodiment.

In the first embodiment, as an example of the exposure condition in the exposure step of Step 2, an embodiment of controlling the light absorption characteristics of the polymerization initiator and the three-dimensional substrate contained in the plated-layer precursor layer and the wavelength of light to be irradiated has been described, but the present invention is of course not limited thereto. That is, the method for producing an electroconductive laminate of the present invention also includes an aspect in which the light absorption characteristics of the polymerization initiator and the three-dimensional substrate contained in the plated-layer precursor layer and the wavelength of light to be irradiated are not controlled.

Hereinafter, materials used in each step and procedures thereof will be described in detail with reference to the accompanying drawings.

[Step 1: Step of Obtaining Three-Dimensional Substrate with Plated-Layer Precursor Layer]

Figure 5:
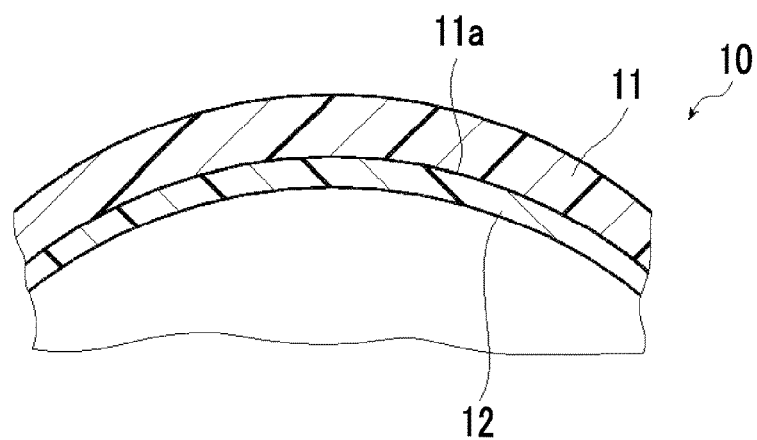
FIG. 5 is a schematic diagram for explaining a first embodiment of a method for producing an electroconductive laminate, and is a partial cross-sectional view illustrating a step of obtaining a plated-layer precursor layer.

Step 1 is a step of obtaining a three-dimensional substrate with a plated-layer precursor layer having a three-dimensional substrate with a three-dimensional shape including a curved surface (hereinafter, also referred to as "three-dimensional substrate") and a plated-layer precursor layer disposed on the three-dimensional substrate, thereby obtaining a substrate. That is, Step 1 is the step of forming a three-dimensional substrate 10 with a plated-layer precursor layer as shown in FIG. 5.

In Step 1, a plated-layer precursor layer (unexposed coating film) 12 is disposed on the surface 11a of a region having a three-dimensional shape including a curved surface of the three-dimensional substrate 11, for example, by a coating method. Hereinafter, various materials and procedures used in Step 1 will be described in detail.

The three-dimensional substrate is not particularly limited as long as it is a substrate having a three-dimensional shape (note that the term "substrate" refers to one having two principal surfaces). Specifically, a three-dimensional substrate having a three-dimensional shape including a curved surface, as shown in FIGS. 3 and 4, can be mentioned as the substrate having a three-dimensional shape. Further, the material for the substrate may be, for example, an insulating material. Specifically, it is preferable to use a resin, ceramic, glass, or the like, and it is more preferable to use a resin.

The three-dimensional substrate can be formed by molding a resin substrate into a desired three-dimensional shape by a method such as thermoforming. In addition, a pressure-sensitive adhesive sheet to be described later is also included as the resin substrate.

Examples of the material for the resin substrate include a polyester-based resin (polyethylene terephthalate or polyethylene naphthalate), a polyethersulfone-based resin, a poly(meth)acrylic resin, a polyurethane-based resin, a polycarbonate-based resin, a polysulfone-based resin, a polyamide-based resin, a polyarylate-based resin, a polyolefin-based resin, a cellulose-based resin, a polyvinyl chloride-based resin, and a cycloolefin-based resin. Among them, preferred is a polyester-based resin (for example, polyethylene terephthalate or polyethylene naphthalate), or a polyolefin-based resin. The term "poly(meth) acrylic resin" refers to a polyacrylic resin or a polymethacrylic resin.

Further, a pressure-sensitive adhesive substrate, that is, a pressure-sensitive adhesive sheet may be used as the resin substrate. A known material (an acrylic pressure-sensitive adhesive, a silicone-based pressure-sensitive adhesive, or the like) may be used as the material constituting the pressure-sensitive adhesive sheet.

The thickness (mm) of the three-dimensional substrate is not particularly limited. From the viewpoint of the balance of handleability and being made into a thin thickness, the thickness of the resin substrate is preferably 0.01 to 2 mm, more preferably 0.02 to 1 mm, and still more preferably 0.03 to 0.1 mm. Further, the thickness of the glass substrate is preferably 0.01 to 2 mm, more preferably 0.3 to 0.8 mm, and still more preferably 0.4 to 0.7 mm.

The three-dimensional substrate is preferably one having excellent transparency, and the transmittance (%) thereof at a wavelength of 400 nm is preferably 80% or more, more preferably 85% or more, still more preferably 90% or more, or even more preferably 95% or more. The transmittance can be measured using a UV/is/NIR spectrophotometer V-7200F (manufactured by JASCO Corporation).

In FIG. 3, a three-dimensional substrate having a hemispherical three-dimensional shape has been shown as the three-dimensional substrate, but the three-dimensional substrate is not limited to this form. For example, a three-dimensional substrate having a three-dimensional shape such as a fish sausage shape, a corrugated shape, an uneven shape, a columnar shape, or a prismatic shape can be mentioned.

The position of the absorption edge on the long wavelength side of the ultraviolet-visible absorption spectrum of the three-dimensional substrate is preferably located on a longer wavelength side than the absorption edge on the long wavelength side of the ultraviolet-visible absorption spectrum of the polymerization initiator contained in the plated-layer precursor layer.

The position of the absorption edge on the long wavelength side of the ultraviolet-visible absorption spectrum of the three-dimensional substrate is not particularly limited, but it is preferably 400 nm or less, more preferably 380 nm or less, and still more preferably 320 nm or less, from the viewpoint of excellent transparency and visibility of an electroconductive laminate which will be formed. The lower limit thereof is not particularly limited, but it is 250 nm or more in many cases from the viewpoint of material properties.

Further, the absorption edge on the long wavelength side of the ultraviolet-visible absorption spectrum of the three-dimensional substrate is intended to refer to a wavelength of the longest wavelength side at which an absorbance becomes 1.0 or less in the case where the ultraviolet-visible absorption spectrum of the three-dimensional substrate is measured by UV-3000 (Shimadzu Corporation).

The three-dimensional substrate may contain an ultraviolet absorber. By the incorporation of the ultraviolet absorber, the absorption edge of the ultraviolet-visible absorption spectrum of the three-dimensional substrate is shifted to the longer wavelength side and is therefore likely to position on longer wavelength side than the absorption edge of the ultraviolet-visible absorption spectrum of a polymerization initiator contained in the plated-layer precursor layer to be described hereinafter.

Further, as the ultraviolet absorber, it is preferred to select an ultraviolet absorber having an absorption edge on the longer wavelength side than the absorption edge on the long wavelength side of the ultraviolet-visible absorption spectrum of a polymerization initiator contained in the plated-layer precursor layer to be described hereinafter. That is, the absorption edge on the long wavelength side of the ultraviolet-visible absorption spectrum of the ultraviolet absorber to be used is preferably on the longer wavelength side than the absorption edge on the long wavelength side of the ultraviolet-visible absorption spectrum of the polymerization initiator contained in the plated-layer precursor layer.

Further, the method of measuring the absorption edge of the ultraviolet-visible absorption spectrum of the three-dimensional substrate in the case of using an ultraviolet absorber may also be similar to the above-mentioned procedure.

The type of the ultraviolet absorber to be used is not particularly limited. Known ultraviolet absorbers may be used, and examples thereof include a salicylic acid-based ultraviolet absorber, a benzophenone-based ultraviolet absorber, a benzotriazole-based ultraviolet absorber, a cyanoacrylate-based ultraviolet absorber, a benzoate-based ultraviolet absorber, a malonate-based ultraviolet absorber, and an oxalic acid anilide-based ultraviolet absorber.

Examples of the salicylic acid-based ultraviolet absorber include phenyl salicylate, p-tert-butylphenyl salicylate, and p-octylphenyl salicylate. Examples of the benzophenone-based ultraviolet absorber include 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, and bis(2-methoxy-4-hydroxy-5-benzoylphenyl)methane. Examples of the benzotriazole-based ultraviolet absorber include 2-(2H-benzotriazol-2-yl)-4-(1,1,3,3-tetramethylbutyl)phenol, 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-3'-tert-butyl-5'-methylphenyl)-5-chlorobenzotriazole, 2-(2'-hydroxy-3',5'-di-tert-butyl-phenyl)-5-chlorobenzotriazole, 2-(2'-hydroxy-3',5'-di-tert-butyl-5'-amylphenyl)benzotriazole, and 2-(2'-hydroxy-4'-octoxyphenyl)benzotriazole. Examples of the cyanoacrylate-based ultraviolet absorber include 2-ethylhexyl-2-cyano-3,3'-diphenyl acrylate, and ethyl-2-cyano-3,3'-diphenyl acrylate.

The three-dimensional substrate may have a single layer structure or a multilayer structure.

In the case where the three-dimensional substrate has a multilayer structure, the substrate structure may be, for example, a laminate having a support and an ultraviolet absorbing layer containing an ultraviolet absorber disposed on the support.

The support may or may not contain an ultraviolet absorber. Examples of the material for the support include those exemplified above as the material of the three-dimensional substrate.

The ultraviolet absorbing layer contains at least an ultraviolet absorber. Examples of the ultraviolet absorber include those described above. Further, the ultraviolet absorber may contain a binder such as a resin.

<Plated-Layer Precursor Layer>

The plated-layer precursor layer is a layer which has a functional group capable of interacting with a plating catalyst or a precursor thereof, and a polymerizable group and becomes a patterned plated layer by being cured into a pattern by exposure to be described hereinafter.

The plated-layer precursor layer preferably contains at least a polymerization initiator and Compound X or Composition Y given below. More specifically, the plated-layer precursor layer may be a layer containing a polymerization initiator and Compound X, or a layer containing a polymerization initiator and Composition Y.

Compound X: a compound having a functional group capable of interacting with a plating catalyst or a precursor thereof (hereinafter, simply referred to also as an "interactive group"), and a polymerizable group Composition Y: a composition containing a compound having a functional group capable of interacting with a plating catalyst or a precursor thereof, and a compound having a polymerizable group Hereinafter, first, materials contained in the plated-layer precursor layer will be described in detail.

(Polymerization Initiator)

The polymerization initiator is not particularly limited, and a known polymerization initiator (so-called photopolymerization initiator) or the like can be used. It is preferable to use a polymerization initiator whose absorption edge on the long wavelength side of the ultraviolet-visible absorption spectrum is located on the shorter wavelength side than the absorption edge on the long wavelength side of the ultraviolet-visible absorption spectrum of the three-dimensional substrate.

Examples of the polymerization initiator include benzophenones, acetophenones, α-aminoalkylphenones, benzoins, ketones, thioxanthones, benzyls, benzyl ketals, oxime esters, anthrones, tetramethylthiuram monosulfides, bisacylphosphine oxides, acylphosphine oxides, anthraquinones, azo compounds, and derivatives thereof.

The absorption edge of the ultraviolet-visible absorption spectrum of the polymerization initiator is intended to refer to a wavelength of the longest wavelength side at which an absorbance becomes 1.0 or less in the case where a solution having a polymerization initiator concentration of 0.01% by mass (using a solvent in which a polymerization initiator is dissolved, for example, acetonitrile, as a solvent) is prepared and the absorbance is measured by UV-3000.

Further, as described above, the absorption edge on the long wavelength side of the ultraviolet-visible absorption spectrum of the polymerization initiator is preferably located on the shorter wavelength side than the absorption edge on the long wavelength side of the ultraviolet-visible absorption spectrum of the three-dimensional substrate, and a wavelength difference therebetween (wavelength (nm) of absorption edge on the long wavelength side of the ultraviolet-visible absorption spectrum of the three-dimensional substrate–wavelength (nm) of absorption edge on the long wavelength side of the ultraviolet-visible absorption spectrum of the polymerization initiator) is preferably 5 nm or more and more preferably 10 nm or more, from the viewpoint of easy absorption of light by the three-dimensional substrate. The upper limit thereof is not particularly limited, but it is about 150 nm in many cases.

The content of the polymerization initiator in the plated-layer precursor layer is not particularly limited, but from the viewpoint of the curability of the plated layer, it is preferably 0.01% to 5% by mass and more preferably 0.1% to 3% by mass with respect to the total mass of the plated-layer precursor layer.

(Compound X)

Compound X is a compound having an interactive group and a polymerizable group.

The interactive group is intended to refer to a functional group capable of interacting a plating catalyst or a precursor thereof which is applied to a patterned plated layer. For example, a functional group capable of forming an electrostatic interaction with a plating catalyst or a precursor thereof, or a nitrogen-, sulfur- or oxygen-containing functional group capable of coordinating with a plating catalyst and a precursor thereof may be used.

More specific examples of the interactive group include nitrogen-containing functional groups such as an amino group, an amide group, an imido group, a urea group, a tertiary amino group, an ammonium group, an amidino group, a triazine ring, a triazole ring, a benzotriazole group, an imidazole group, a benzimidazole group, a quinoline group, a pyridine group, a pyrimidine group, a pyrazine group, a nazoline group, a quinoxaline group, a purine group, a triazine group, a piperidine group, a piperazine group, a pyrrolidine group, a pyrazole group, an aniline group, a group containing an alkylamine structure, a group containing an isocyanuric structure, a nitro group, a nitroso group, an azo group, a diazo group, an azide group, a cyano group, and a cyanate group; oxygen-containing functional groups such as an ether group, a hydroxyl group, a phenolic hydroxyl group, a carboxylic acid group, a carbonate group, a carbonyl group, an ester group, a group containing an N-oxide structure, a group containing an S-oxide structure, and a group containing an N-hydroxy structure; sulfur-containing functional groups such as a thiophene group, a thiol group, a thiourea group, a thiocyanurate group, a benzothiazole group, a mercaptotriazine group, a thioether group, a thioxy group, a sulfoxide group, a sulfone group, a sulfite group, a group containing a sulfoximine structure, a group containing a sulfoxinium salt structure, a sulfonate group, and a group containing a sulfonic ester structure; phosphorus-containing functional groups such as a phosphate group, a phosphoramide group, a phosphine group, and a group containing a phosphoric ester structure; and groups containing halogen atoms such as a chlorine atom and a bromine atom. In a functional group that may have a salt structure, a salt thereof may also be used.

Among them, preferred is an ionic polar group such as a carboxylic acid group, a sulfonate group, a phosphate group or a boronate group, an ether group, or a cyano group, and more preferred is a carboxylic acid group (carboxyl group) or a cyano group, from the viewpoint of high polarity and high adsorptivity to a plating catalyst or a precursor thereof.

Compound X may contain two or more types of interactive groups.

The polymerizable group is a functional group capable of forming a chemical bond through the application of energy, and examples thereof include a radically polymerizable group and a cationic polymerizable group. Among them, a radically polymerizable group is preferable from the viewpoint of superior reactivity. Examples of the radically polymerizable group include unsaturated carboxylic ester groups such as an acrylic ester group (acryloyloxy group), methacrylic ester group (methacryloyloxy group), an itaconic ester group, a crotonic ester group, an isocrotonic ester group, and a maleic ester group; a styryl group, a vinyl group, an acrylamide group, and an methacrylamide group. Among them, preferred is a methacryloyloxy group, an acryloyloxy group, a vinyl group, a styryl group, an acrylamide group, or methacrylamide group and more preferred is a methacryloyloxy group, an acryloyloxy group, or a styryl group.

The compound X may contain two or more polymerizable groups. The number of the polymerizable groups contained in the compound X is not particularly limited and may be one or two or more.

Compound X may be a low molecular weight compound or a high molecular weight compound. The low molecular weight compound is intended to refer to a compound having a molecular weight of less than 1,000, and the high molecular weight compound is intended to refer to a compound having a molecular weight of 1,000 or more.

Further, the low molecular weight compound having a polymerizable group corresponds to a so-called monomer. Further, the high molecular weight compound may be a polymer having a predetermined repeating unit.

Further, the compounds may be used alone or in combination of two or more thereof.

In the case where Compound X is a polymer, the weight-average molecular weight of the polymer is not particularly limited and is preferably 1,000 or more and 700,000 or less and more preferably 2,000 or more and 200,000 or less, from the viewpoint of superior handleability such as solubility. In particular, the weight-average molecular weight is more preferably 20,000 or more from the viewpoint of polymerization sensitivity.

The method of synthesizing such a polymer having a polymerizable group and an interactive group is not particularly limited and a known synthesis method (see paragraphs [0097] to [0125] of JP2009-280905A) is used.

The weight-average molecular weight of the polymer can be measured by a gel permeation chromatography (GPC) method.

The GPC method is based on a method using HLC-8020 GPC (manufactured by Tosoh Corporation) and using TSKgel Super HZM-H, TSKgel Super HZ4000, and TSKgel Super HZ2000 (manufactured by Tosoh Corporation, 4.6 mm ID×15 cm) as columns and tetrahydrofuran (THF) as an eluent.

<<Suitable Aspect 1 of Polymer>>

A first preferred aspect of the polymer may be, for example, a copolymer containing a polymerizable group-containing repeating unit represented by Formula (a) (hereinafter, also referred to as a "polymerizable group unit" where appropriate) and an interactive group-containing repeating unit represented by Formula (b) (hereinafter, also referred to as an "interactive group unit" where appropriate).

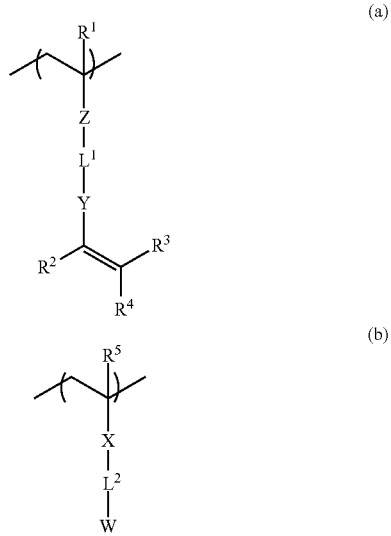

In Formulae (a) and (b), $R^1$ to $R^5$ each independently represent a hydrogen atom, or a substituted or unsubstituted alkyl group (for example, a methyl group, an ethyl group, a propyl group, or a butyl group). Further, the type of the substituent is not particularly limited, and examples thereof include a methoxy group, a chlorine atom, a bromine atom, and a fluorine atom.

$R^1$ is preferably a hydrogen atom, a methyl group, or a methyl group substituted with a bromine atom. $R^2$ is preferably a hydrogen atom, a methyl group, or a methyl group substituted with a bromine atom. $R^3$ is preferably a hydrogen atom. $R^4$ is preferably a hydrogen atom. $R^5$ is preferably a hydrogen atom, a methyl group, or a methyl group substituted with a bromine atom.

In Formulae (a) and (b), X, Y, and Z each independently represent a single bond, or a substituted or unsubstituted divalent organic group. Examples of the divalent organic group include a substituted or unsubstituted divalent aliphatic hydrocarbon group (which preferably contains 1 to 8 carbon atoms. For example, an alkylene group such as a methylene group, an ethylene group, or a propylene group), a substituted or unsubstituted divalent aromatic hydrocarbon group (which preferably contains 6 to 12 carbon atoms. For example, a phenylene group), —O—, —S—, —SO$_2$—, —N(R)— (R: alkyl group), —CO—, —NH—, —COO—, —CONH—, and a group formed by combining these groups (for example, an alkyleneoxy group, an alkyleneoxycarbonyl group, or an alkylenecarbonyloxy group).

X, Y, and Z are each preferably a single bond, an ester group (—COO—), an amide group (—CONH—), an ether group (—O—), or a substituted or unsubstituted divalent aromatic hydrocarbon group and more preferably a single bond, an ester group (—COO—), or an amide group (—CONH—), from the viewpoint of easy polymer synthesis and superior adhesiveness of a metal layer.

In Formulae (a) and (b), $L^1$ and $L^2$ each independently represent a single bond, or a substituted or unsubstituted divalent organic group. The divalent organic group has the same definition as in the divalent organic group described for X, Y, and Z above.

$L^1$ is preferably an aliphatic hydrocarbon group or a divalent organic group (for example, an aliphatic hydrocarbon group) having a urethane bond or a urea bond from the viewpoint of easy polymer synthesis and superior adhesiveness of a metal layer. Among them, more preferred are groups having a total number of 1 to 9 carbon atoms. The total number of carbon atoms in $L^1$ refers to the total number of carbon atoms contained in the substituted or unsubstituted divalent organic group represented by $L^1$.

Further, $L^2$ is preferably a single bond, a divalent aliphatic hydrocarbon group, a divalent aromatic hydrocarbon group, or a group formed by combining these groups, from the viewpoint of superior adhesiveness of a metal layer. Among them, $L^2$ is more preferably a single bond or has a total number of 1 to 15 carbon atoms. The divalent organic group is preferably unsubstituted. Here, the total number of carbon atoms in $L^2$ refers to a total number of carbon atoms contained in the substituted or unsubstituted divalent organic group represented by L.

In Formula (b), W represents an interactive group. The definition of the interactive group is as described above.

The content of the polymerizable group unit is preferably 5 to 50 mol % and more preferably 5 to 40 mol % with respect to the total repeating units in the polymer, from the viewpoint of reactivity (curability or polymerizability) and inhibition of gelation during synthesis.

Further, the content of the interactive group unit is preferably 5 to 95 mol % and more preferably 10 to 95 mol % with respect to the total repeating units in the polymer, from the viewpoint of adsorptivity to a plating catalyst or a precursor thereof.

<<Suitable Aspect 2 of Polymer>>

The second preferred aspect of the polymer may be, for example, a copolymer containing repeating units represented by Formula (A), Formula (B), and Formula (C).

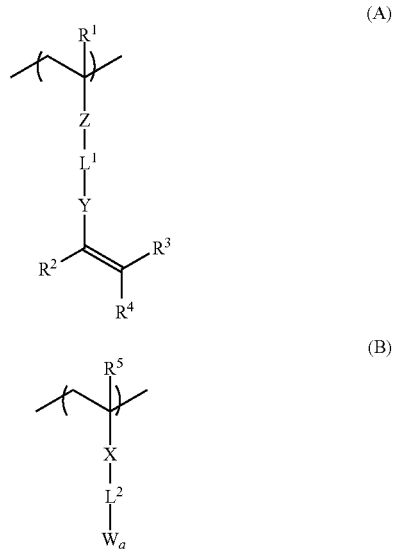

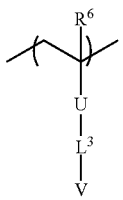

The repeating unit represented by Formula (A) is the same as the repeating unit represented by Formula (a), and the same also applies to the description of each group.

$R^5$, X and $L^2$ in the repeating unit represented by Formula (B) is the same as $R^5$, X and $L^2$ in the repeating unit represented by Formula (b), and the same also applies to the description of each group.

Wa in Formula (B) represents a group capable of interacting with a plating catalyst or a precursor thereof, excluding a hydrophilic group or a precursor group thereof represented by V to be described hereinafter. Among them, preferred is a cyano group or an ether group.

In Formula (C), $R^6$'s each independently represent a hydrogen atom or a substituted or unsubstituted alkyl group.

In Formula (C), U represents a single bond or a substituted or unsubstituted divalent organic group. The definition of the divalent organic group is the same as that of the above-mentioned divalent organic group represented by X, Y and Z. U is preferably a single bond, an ester group (—COO—), an amide group (—CONH—), an ether group (—O—), or a substituted or unsubstituted divalent aromatic hydrocarbon group, from the viewpoint of easy polymer synthesis and superior adhesiveness of a metal layer.

In Formula (C), $L^3$ represents a single bond or a substituted or unsubstituted divalent organic group. The definition of the divalent organic group is the same as that of the above-mentioned divalent organic group represented by $L^1$ and $L^2$. $L^3$ is preferably a single bond, or a divalent aliphatic hydrocarbon group, a divalent aromatic hydrocarbon group, or a group formed by combining these groups, from the viewpoint of easy polymer synthesis and superior adhesiveness of a metal layer.

In Formula (C), V represents a hydrophilic group or a precursor group thereof. The hydrophilic group is not particularly limited as long as it is a group exhibiting hydrophilicity, and examples thereof include a hydroxyl group and a carboxylic acid group. The precursor group of the hydrophilic group refers to a group capable of generating a hydrophilic group by a predetermined treatment (for example, treatment with an acid or alkali), and examples thereof include a carboxyl group protected with a 2-tetrahydropyranyl (THP) group.

The hydrophilic group is preferably an ionic polar group from the viewpoint of interaction with a plating catalyst or a precursor thereof. Specific examples of the ionic polar group include a carboxylic acid group, a sulfonate group, a phosphate group, and a boronate group. Among them, preferred is a carboxylic acid group from the viewpoint of moderate acidity (not degrading other functional groups).

The preferred content of each unit in the second preferred aspect of the polymer is as follows.

The content of the repeating unit represented by Formula (A) is preferably 5 to 50 mol % and more preferably 5 to 30 mol % with respect to the total repeating units in the polymer, from the viewpoint of reactivity (curability or polymerizability) and inhibition of gelation during synthesis.

The content of the repeating unit represented by Formula (B) is preferably 5 to 75 mol % and more preferably 10 to 70 mol % with respect to the total repeating units in the polymer, from the viewpoint of adsorptivity to a plating catalyst or a precursor thereof.

The content of the repeating unit represented by Formula (C) is preferably 10 to 70 mol %, more preferably 20 to 60 mol %, and still more preferably 30 to 50 mol % with respect to the total repeating units in the polymer, from the viewpoint of developability with an aqueous solution and humidity-resistant adhesiveness.

Specific examples of the above-mentioned polymer include polymers described in paragraphs [0106] to [0112] of JP2009-007540A, polymers described in paragraphs [0065] to [0070] of JP2006-135271A, and polymers described in paragraphs [0030] to [0108] of US2010-080964A.

These polymers can be produced by known methods (for example, methods in the literature listed above).

<<Suitable Aspect of Monomer>>

In the case where the compound is a so-called monomer, a compound represented by Formula (X) can be mentioned as one suitable aspect.

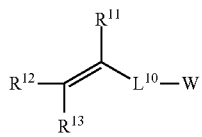

In Formula (X), $R^{11}$ to $R^{13}$ each independently represent a hydrogen atom or a substituted or unsubstituted alkyl group. Examples of the unsubstituted alkyl group include a methyl group, an ethyl group, a propyl group, and a butyl group. Examples of the substituted alkyl group include a methyl group, an ethyl group, a propyl group, and a butyl group each of which is substituted with a methoxy group, a chlorine atom, a bromine atom, a fluorine atom, or the like. $R^{11}$ is preferably a hydrogen atom or a methyl group. $R^{12}$ is preferably a hydrogen atom. $R^{13}$ is preferably a hydrogen atom.

$L^{10}$ represents a single bond or a divalent organic group. Examples of the divalent organic group include a substituted or unsubstituted aliphatic hydrocarbon group (preferably having 1 to 8 carbon atoms), a substituted or unsubstituted aromatic hydrocarbon group (preferably having 6 to 12 carbon atoms), —O—, —S—, —SO$_2$—, —N(R)— (R: alkyl group), —CO—, —NH—, —COO—, —CONH—, and a group formed by combining these groups (for example, an alkyleneoxy group, an alkyleneoxycarbonyl group, or an alkylenecarbonyloxy group).

The substituted or unsubstituted aliphatic hydrocarbon group is preferably a methylene group, an ethylene group, a propylene group or a butylene group, or such a group substituted with a methoxy group, a chlorine atom, a bromine atom, a fluorine atom, or the like.

The substituted or unsubstituted aromatic hydrocarbon group is preferably an unsubstituted phenylene group, or a phenylene group substituted with a methoxy group, a chlorine atom, a bromine atom, a fluorine atom, or the like.

In Formula (X), one suitable aspect of $L^{10}$ may be, for example, a —NH-aliphatic hydrocarbon group- or a —CO-aliphatic hydrocarbon group-.

W has the same definition as W in Formula (b) and represents an interactive group. The definition of the interactive group is as described above.

In Formula (X), a suitable aspect of W may be, for example, an ionic polar group and is more preferably a carboxylic acid group.

In the case where the above-mentioned compound is a so-called monomer, a compound represented by Formula (1) may be mentioned as one suitable aspect.

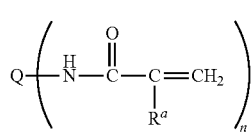

Formula (1)

In Formula (1), Q represents an n-valent linking group, and $R^a$ represents a hydrogen atom or a methyl group. n represents an integer of 2 or more.

$R^a$ represents a hydrogen atom or a methyl group, preferably a hydrogen atom.

From the viewpoint of further improving the adhesiveness between the three-dimensional substrate and the metal layer, the valence n of Q is 2 or more, preferably 2 or more and 6 or less, more preferably 2 or more and 5 or less, and still more preferably 2 or more and 4 or less.

Examples of the n-valent linking group represented by Q include a group represented by the Formula (1A), a group represented by the formula (1B),

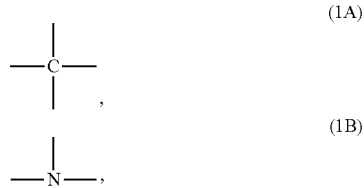

—NH—, —NR (where R represents an alkyl group)-, —O—, —S—, a carbonyl group, an alkylene group, an alkenylene group, an alkynylene group, a cycloalkylene group, an aromatic group, a heterocyclic group, or a group obtained by combining two or more of these groups.

With respect to the compound represented by Formula (X), reference can be appropriately made to the description of paragraphs [0019] to [0034] of JP2013-43946A and paragraphs [0070] to [0080] of JP2013-43945A.

(Composition Y)

The Composition Y is a composition containing a compound having an interactive group and a compound having a polymerizable group. That is, the plated-layer precursor layer contains two compounds: a compound having an interactive group and a compound having a polymerizable group. The definition of the interactive group and the polymerizable group is as described above.

The definition of the interactive group contained in the compound having an interactive group is as described above. Such a compound may be a low molecular weight compound or a high molecular weight compound. A suitable aspect of the compound having an interactive group may be, for example, a polymer having a repeating unit represented by Formula (b) (for example, polyacrylic acid). Further, it is preferred that a polymerizable group is not contained in the compound having an interactive group.

The compound having a polymerizable group is a so-called monomer, and is preferably a polyfunctional monomer having two or more polymerizable groups from the viewpoint of superior hardness of a patterned plated layer to be formed. With regard to the polyfunctional monomer, specifically, it is preferred to use a monomer having 2 to 6 polymerizable groups. From the viewpoint of mobility of molecules during the crosslinking reaction which affects the reactivity, the molecular weight of the polyfunctional monomer to be used is preferably 150 to 1,000 and more preferably 200 to 700. Further, the interval (distance) between a plurality of polymerizable groups is preferably 1 to 15 atoms and more preferably 6 to 10 atoms. Specific examples of the polyfunctional monomer include the compound represented by Formula (1).

The compound having a polymerizable group may contain an interactive group.

The mass ratio of the compound having an interactive group:the compound having a polymerizable group (mass of the compound having an interactive group/mass of the compound having a polymerizable group) is not particularly limited, but it is preferably 0.1 to 10 and more preferably 0.5 to 5 in terms of balance of strength of a patterned plated layer to be formed and plating suitability.

The content of Compound X (or Composition Y) in the plated-layer precursor layer is not particularly limited, but it is preferably 50% by mass or more and more preferably 80% by mass or more with respect to the total mass of the plated-layer precursor layer. The upper limit is not particularly limited, but it is preferably 99.5% by mass or less.

The plated-layer precursor layer may contain components other than the above-mentioned polymerization initiator, and Compound X or Composition Y.

For example, the plated-layer precursor layer may contain a monomer (excluding the compound represented by Formula (1)). The inclusion of a monomer can result in appropriate control of a crosslinking density or the like in the patterned plated layer.

The monomer to be used is not particularly limited. For example, there are a compound having an ethylenically unsaturated bond as a compound having addition polymerizability, and a compound having an epoxy group as a compound having a ring-opening polymerizability. Among them, from the viewpoint of improving a crosslinking density in the patterned plated layer, it is preferred to use a polyfunctional monomer. The polyfunctional monomer refers to a monomer having two or more polymerizable groups. Specifically, it is preferred to use a monomer having 2 to 6 polymerizable groups.

If necessary, other additives (for example, a sensitizer, a curing agent, a polymerization inhibitor, an antioxidant, an antistatic agent, a filler, particles, a flame retardant, a surfactant, a lubricant, and a plasticizer) may be added to the plated-layer precursor layer.

(Method of Forming Plated-Layer Precursor Layer)

The method of disposing the plated-layer precursor layer on the three-dimensional substrate is not particularly limited and examples thereof include a method in which a composition containing the above-mentioned various components is applied onto the three-dimensional substrate to form a plated-layer precursor layer, thereby forming a laminate (coating method), and a method in which a plated-layer precursor layer is formed on a temporary substrate and is then transferred to both surfaces of the three-dimensional substrate (transfer method). Among them, a coating method is preferable from the viewpoint of easily controlling the thickness.

Hereinafter, aspects of the coating method will be described in detail.

The composition used in the coating method contains at least the above-mentioned polymerization initiator and Compound X or Composition Y. The composition may contain the above-mentioned other components, if necessary.

Further, the composition preferably contains a solvent, from the viewpoint of handleability.

The solvent that can be used is not particularly limited, and examples thereof include water; an alcohol-based solvent such as methanol, ethanol, propanol, ethylene glycol, 1-methoxy-2-propanol, glycerin, or propylene glycol monomethyl ether; an acid such as acetic acid; a ketone-based solvent such as acetone, methyl ethyl ketone, or cyclohexanone; an amide-based solvent such as formamide, dimethylacetamide, or N-methylpyrrolidone; a nitrile-based solvent such as acetonitrile or propionitrile; an ester-based solvent such as methyl acetate or ethyl acetate; a carbonate-based solvent such as dimethyl carbonate or diethyl carbonate; in addition to those, an ether-based solvent, a glycol-based solvent, an amine-based solvent, a thiol-based solvent, and a halogen-based solvent.

Among them, an alcohol-based solvent, an amide-based solvent, a ketone-based solvent, a nitrile-based solvent, or a carbonate-based solvent is preferred.

The content of the solvent in the composition is not particularly limited, but it is preferably 50 to 98% by mass and more preferably 70 to 95% by mass with respect to the total amount of the composition. In the case where the content of the solvent is within the above-specified range, handleability of the composition is excellent and control of the layer thickness is easy.

In the case of the coating method, for example, a known method such as a spray coating method or a dip coating method can be used.

In the case where the plated-layer precursor layer is disposed on both surfaces of the three-dimensional substrate, the composition may be applied to each surface of the three-dimensional substrate one by one, or the substrate may be immersed in the composition so that the composition is applied to both surfaces of the substrate at once.

From the viewpoint of handleability or production efficiency, an aspect of forming a plated-layer precursor layer by applying the composition onto a three-dimensional substrate, and performing a drying treatment as necessary to remove the remaining solvent is preferable.

The conditions of the drying treatment are not particularly limited, but from the viewpoint of superior productivity, it is preferable to carry out the drying treatment at room temperature to 220° C. (preferably 50° C. to 120° C.) for 1 to 30 minutes (preferably 1 to 10 minutes).

The thickness of the plated-layer precursor layer is not particularly limited, but it is preferably 0.01 to 20 µm, more preferably 0.1 to 10 µm, and still more preferably 0.1 to 5 µm.

Further, the three-dimensional substrate with a plated-layer precursor layer may include layers other than the three-dimensional substrate and the plated-layer precursor layer.

For example, a primer layer may be disposed between the three-dimensional substrate and the plated-layer precursor layer. The disposition of the primer layer results in improved adhesiveness between the patterned plated layer to be described hereinafter and the three-dimensional substrate.

As means for enhancing the adhesiveness of the patterned plated layer by the primer layer, it is possible to adopt various means for improving adhesion, such as means for controlling the surface energy, means for forming a chemical bond with the patterned plated layer, and means for utilizing a pressure-sensitive adhesive force due to stress relaxation. In the case of surface energy control, for example, it is possible to use a low molecular weight layer or high molecular weight layer close to the surface energy of the patterned plated layer. In the case of chemical bond formation, it is possible to use a low molecular weight layer or high molecular weight layer containing a polymerization active site. In the case of using a pressure-sensitive adhesive force due to stress relaxation, it is possible to use a rubber-like resin or the like having a low modulus of elasticity.

The thickness of the primer layer is not particularly limited. Generally, the thickness of the primer layer is preferably 0.01 to 100 µm, more preferably 0.05 to 20 µm, and still more preferably 0.05 to 10 µm.

The material for the primer layer is not particularly limited, but it is preferably a resin having good adhesiveness with a three-dimensional substrate. A specific example of the resin may be a thermosetting resin, a thermoplastic resin, or a mixture thereof. Examples of the thermosetting resin include an epoxy-based resin, a phenol-based resin, a polyimide-based resin, a polyester-based resin, a bismaleimide-based resin, a polyolefin-based resin, and an isocyanate-based resin. Examples of the thermoplastic resin include a phenoxy-based resin, a polyether sulfone-based resin, a polysulfone-based resin, a polyphenylene sulfone-based resin, a polyphenylene sulfide-based resin, a polyphenyl ether-based resin, a polyether imide-based resin, and an ABS resin (acrylonitrile-butadiene-styrene copolymer).

The thermoplastic resins and the thermosetting resins may be respectively used alone or in combination of two or more thereof. Further, a resin containing a cyano group may be used. Specifically, an ABS resin, or the "polymer containing a unit having a cyano group on the side chain" described in paragraphs [0039] to [0063] of JP2010-84196A may also be used.

Further, it may also be possible to use a rubber component such as acrylonitrile/butadiene rubber (NBR rubber) or styrene/butadiene rubber (SBR rubber).

One suitable aspect of the material constituting a primer layer may be, for example, a polymer having a conjugated diene compound unit which may be hydrogenated. The conjugated diene compound unit refers to a repeating unit derived from a conjugated diene compound. The conjugated diene compound is not particularly limited as long as it is a compound having a molecular structure having two carbon-carbon double bonds separated by one single bond.

One suitable aspect of the repeating unit derived from a conjugated diene compound may be, for example, a repeating unit generated by polymerization reaction of a compound having a butadiene skeleton.

The conjugated diene compound unit may be hydrogenated, and in the case of containing a hydrogenated conjugated diene compound unit, adhesiveness of a patterned metal layer is preferably further improved. That is, the double bond in the repeating unit derived from a conjugated diene compound may be hydrogenated.

The polymer having a conjugated diene compound unit which may be hydrogenated may also contain the above-described interactive group.

Examples of suitable aspects of this polymer include an acrylonitrile-butadiene rubber (NBR), a carboxyl group-containing nitrile rubber (XNBR), an acrylonitrile-butadiene-isoprene rubber (NBIR), an ABS resin, and a hydrogenated product thereof (for example, a hydrogenated acrylonitrile-butadiene rubber).

The primer layer may also contain other additives (for example, a sensitizer, an antioxidant, an antistatic agent, an ultraviolet absorber, a filler, particles, a flame retardant, a surfactant, a lubricant, and a plasticizer).

The method of forming a primer layer is not particularly limited, and examples thereof include a method in which a resin to be used is laminated on a three-dimensional substrate, and a method in which necessary components are dissolved in a solvent capable of dissolving such components, and the resulting solution is applied and dried on a three-dimensional substrate surface by a method such as coating.

With respect to the heating temperature and time in a coating method, the conditions under which a coating solvent can be sufficiently dried may be selected. From the viewpoint of manufacturing suitability, it is preferred to select the heating conditions in which the heating temperature is 200° C. or lower and the heating time is within 60 minutes, and it is more preferred to select the heating conditions in which the heating temperature is 40° C. to 100° C. and the heating time is within 20 minutes. Regarding the solvent to be used, an optimum solvent (for example, cyclohexanone or methyl ethyl ketone) is suitably selected depending on the resin to be used.

[Step 2: Step of Forming Three-Dimensional Substrate with Patterned Plated Layer]

The present step 2 is a step of exposing the plated-layer precursor layer in a patternwise manner to cure the exposed portion. Here, the irradiation light in the exposure corresponds to light having a wavelength on the shorter wavelength side than the absorption edge on the long wavelength side of the ultraviolet-visible absorption spectrum of the substrate, and a wavelength at which the polymerization initiator is sensitized. Further, in Step 2, the unirradiated region of the plated layer forming layer is further removed to form a patterned plated layer.

Figure 6:
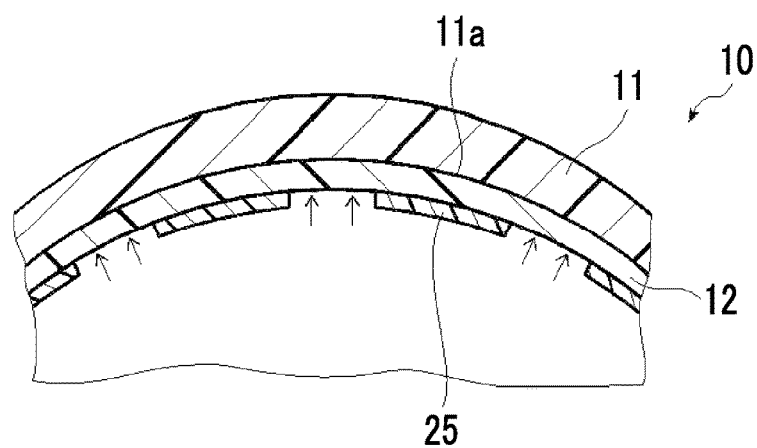
FIG. 6 is a schematic diagram for explaining the first embodiment of the method for producing an electroconductive laminate, and is a partial cross-sectional view illustrating a step of obtaining a patterned plated layer.

More specifically, as shown in FIG. 6, a predetermined irradiation region (opening region of the photo mask 25) of the plated-layer precursor layer 12 is irradiated with light having a wavelength at which the polymerization initiator is sensitized. As described above, in the present embodiment, since light irradiated to the plated-layer precursor layer 12 is absorbed by the three-dimensional substrate 11, reflection hardly occurs on the substrate surface even in a region having a large curvature in particular. As a result, it is possible to suppress the exposure in the unexposed part caused by a part of the reflected light re-entering the plated-layer precursor layer 12, and therefore it is possible to form a pattern with a predetermined line width.

Figure 7:
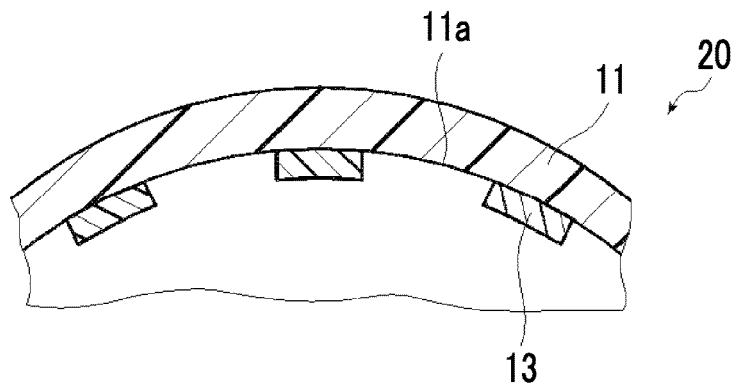
FIG. 7 is a schematic diagram for explaining the first embodiment of the method for producing an electroconductive laminate, and is a partial cross-sectional view illustrating a step of forming a metal layer.

Depending on the function of the interactive group, the patterned plated layer 13 (see FIG. 7) of the three-dimensional substrate 20 with a patterned plated layer formed by the above step adsorbs (adheres to) a plating catalyst or a precursor thereof in the step 3 to be described later. That is, the patterned plated layer 13 functions as a good layer of receiving the plating catalyst or the precursor thereof. In addition, the polymerizable group which the plated-layer precursor layer 12 had is utilized for bonding of compounds through a curing treatment by exposure, and therefore the patterned plated layer 13 having excellent hardness can be obtained.

The method of exposing the plated-layer precursor layer on the three-dimensional substrate in a patternwise manner is not particularly limited, and examples thereof include a method of irradiating actinic rays or radiation. As irradiation with actinic rays, a UV (ultraviolet) lamp or light irradiation by visible light or the like is used. Examples of the light source include a mercury lamp, a metal halide lamp, a xenon lamp, a chemical lamp, and a carbon arc lamp. Examples of the radiation include electron beams, X-rays, ion beams, and far infrared rays.

Specific aspects of exposing the coating film on the three-dimensional substrate in a patternwise manner suitably include scanning exposure by an infrared laser, high-illumination flash exposure such as a xenon discharge lamp exposure using a mask, and infrared lamp exposure using a mask. By exposing the coating film, the polymerizable group contained in the compound in the plated-layer precursor layer is activated to result in crosslinking between the compounds, and the curing of the layer progresses. The exposure energy may be about 10 to 8,000 mJ/cm$^2$ and is preferably in the range of 50 to 3,000 mJ/cm$^2$.

The method of carrying out the exposure treatment in a patternwise manner is not particularly limited, and a known method is adopted. For example, exposure light may be irradiated onto the plated-layer precursor layer through a photo mask. As the photo mask, it is preferable to use a photo mask having a three-dimensional shape corresponding to the surface shape of the plated-layer precursor layer disposed on the three-dimensional substrate and having an opening portion.

The photo mask is obtained, for example, by molding a plate-like thermoplastic resin film into a three-dimensional shape corresponding to the surface shape of the plated-layer precursor layer disposed on the three-dimensional substrate. The molding processing method is not particularly limited, and examples thereof include a vacuum molding method and a press molding method. From the viewpoint of maintaining the accuracy of the pattern formed on the mask, a method using a jig is preferable. As a method for producing a photo mask using a jig, for example, a method in which a thermoplastic resin film to be molded is softened by heating, then the film softened by heating is carried on a jig and vacuuming is carried out, such that the film is molded into a shape of a jig can be mentioned. The molding temperature is preferably 100° C. or higher and more preferably 150° C. or higher from the viewpoint of accurately molding to a shape as per the jig. The molding temperature is preferably 300° C. or lower and more preferably 250° C. or lower from the viewpoint of film durability.

Next, the unexposed part in the plated-layer precursor layer 12 is removed to form the patterned plated layer 13.

The removal method is not particularly limited, and an optimum method is appropriately selected according to the compound to be used. For example, a method in which an alkaline solution (preferably pH: 13.0 to 13.8) is used as a developer can be mentioned. In the case where an alkaline solution is used to remove an unexposed part, there are a method of immersing a three-dimensional substrate having an exposed plated-layer precursor layer in a solution (immersion method), a method of applying a developer onto a three-dimensional substrate having an exposed plated-layer precursor layer (coating method), and the like, among which the immersion method is preferable. In the case of the immersion method, the immersion time is preferably about 1 to 30 minutes from the viewpoints of productivity and workability.

Another method may be, for example, a method in which a solvent in which a compound to be used is dissolved is used as a developer and the substrate is immersed in the solvent.

Hereinafter, various materials and procedures used in Step 2 will be described in detail.

<Patterned Plated Layer>

The patterned plated layer is a layer containing the above-mentioned interactive group. As will be described later, the patterned plated layer is subjected to a plating treatment.

The thickness of the patterned plated layer formed by the above treatment is not particularly limited, but from the viewpoint of productivity, it is preferably 0.01 to 10 µm, more preferably 0.2 to 5 µm, and still more preferably 0.3 to 1.0 µm.

Figure 8:
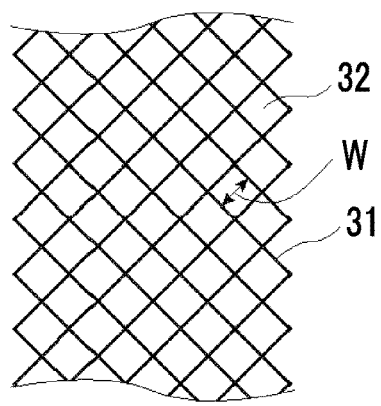
FIG. 8 is a schematic diagram showing an example of a pattern shape.

FIG. 8 is a partially enlarged top view of the patterned plated layer, in which the patterned plated layer is composed of a plurality of thin lines 31 and has a mesh-like pattern including a plurality of lattices 32 by intersecting thin lines 31. The length W of one side of the lattice (opening portion) in the mesh pattern is preferably 800 µm or less and more preferably 600 µm or less and is preferably 50 µm or more and more preferably 400 µm or more. In FIG. 8, the lattice 32 has a substantially diamond shape. However, it may be a polygonal shape (for example, triangle, quadrangle, hexagon, or random polygon). In addition to the linear shape, the shape of one side may be a curved shape or an arc shape. In the case of an arc shape, for example, with respect to two opposing sides, it may be formed into an outwardly convex arc shape, and with respect to the other two opposite sides, it may be formed into an inwardly convex arc shape. Further, the shape of each side may be formed into a wavy line shape in which an outwardly convex arc and an inwardly convex arc are continuous. Of course, the shape of each side may be formed into a sine curve.

Figure 9:
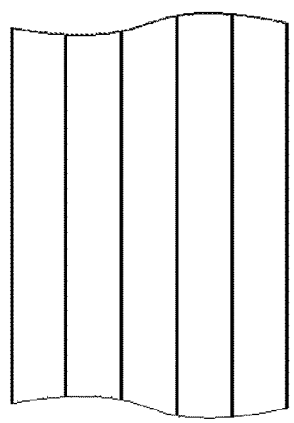
FIG. 9 is a schematic diagram showing another example of a pattern shape.

In FIG. 8, the patterned plated layer has a mesh-like pattern, but it is not limited to this pattern, and the patterned plated layer may have a stripe pattern as shown in FIG. 9.

The line width of the patterned plated layer is not particularly limited, but it is preferably 30 µm or less, more preferably 20 µm or less, still more preferably 15 µm or less, even more preferably 10 µm or less, particularly preferably 9 µm or less, and most preferably 7 µm or less, from the viewpoint of visibility of the metal layer disposed on the patterned plated layer. On the other hand, the lower limit thereof is preferably 0.5 µm or more and more preferably 1.0 µm or more.

From the viewpoint of the transmittance, the region where the patterned plated layer is formed is preferably 50 area % or less, more preferably 40 area % or less, and still more preferably 30 area % or less, with respect to the total surface area of the three-dimensional substrate.

[Step 3: Metal Layer Forming Step]

Step 3 is a step in which a plating catalyst or a precursor thereof is applied to the patterned plated layer formed in Step 2, and a plating treatment is carried out on the patterned plated layer to which a plating catalyst or a precursor thereof has been applied, so that a metal layer is formed on the patterned plated layer. As shown in FIGS. 3 and 4, by carrying out the present step, a metal layer 14 is disposed on a patterned plated layer 13, so an electroconductive laminate 30 is obtained.

Hereinafter, the step of applying a plating catalyst or a precursor thereof to the patterned plated layer (Step 3-1) and the step of carrying out a plating treatment on the patterned plated layer to which a plating catalyst or a precursor thereof has been applied (Step 3-2) will be described separately.

(Step 3-1: Plating Catalyst Applying Step)

In the present step, first, a plating catalyst or a precursor thereof is applied to a patterned plated layer. The above-mentioned interactive group contained in the patterned plated layer adheres to (adsorbs) the applied plating catalyst or precursor thereof, according to the function thereof. More specifically, the plating catalyst or the precursor thereof is applied in the patterned plated layer and on the surface of the patterned plated layer.

The plating catalyst or the precursor thereof functions as a catalyst or electrode of a plating treatment. Therefore, the type of the plating catalyst or the precursor thereof to be used is appropriately determined in accordance with the type of the plating treatment.

Further, the plating catalyst or the precursor thereof to be used is preferably an electroless plating catalyst or a precursor thereof.

Any plating catalyst may be used as the plating catalyst used in the present step as long as it serves as an active nucleus during plating. Specifically, a metal having a catalytic capacity of the autocatalytic reduction reaction (which is known as a metal capable of electroless plating with lower ionization tendency than Ni) may be used. Specific examples thereof include Pd, Ag, Cu, Ni, Pt, Au, and Co. Among them, preferred is Ag, Pd, Pt, or Cu from the viewpoint of high catalytic capacity.

A metallic colloid may be used as the plating catalyst.

The plating catalyst precursor in the present step can be used without any particular limitation as long as it may be converted into the plating catalyst by a chemical reaction. Metal ions of the metals illustrated above for the plating catalyst are mainly used. The metal ions which are the plating catalyst precursors are converted by the reduction reaction into zero-valent metals which are the plating catalysts. After the metal ion as the plating catalyst precursor is applied to the patterned plated layer, the electroless plating catalyst precursor may be separately converted into a zero-valent metal as the plating catalyst by the reduction reaction before being immersed in a plating bath. Alternatively, the plating catalyst precursor may be immersed into the plating bath without any treatment to be converted into a metal (plating catalyst) by the action of a reducing agent in the plating bath.

The metal ion is preferably applied to the patterned plated layer using a metal salt. The metal salt to be used is not particularly limited as long as it is dissolved in a suitable solvent and dissociated into a metal ion and a base (anion), and example thereof include $M(NO_3)_n$, $MCl_n$, $M_{2/n}(SO_4)$, and $M_{3/n}(PO_4)$ (M represents an n-valent metal atom). As metal ions, those metal ions dissociated from the foregoing metal salts can be suitably used. Specific examples thereof include Ag ions, Cu ions, Al ions, Ni ions, Co ions, Fe ions, and Pd ions, among which those capable of being coordinated at multiple sites are preferable, and Ag ions or Pd ions are more preferable from the viewpoints of the number of types of functional groups capable of being coordinated and the catalytic capacity.

As a method for applying a metal ion to the patterned plated layer, for example, a solution containing a dissociated metal ion may be prepared by dissolving a metal salt in a suitable solvent, and then the solution may be applied onto the patterned plated layer, or alternatively, a three-dimensional substrate on which the patterned plated layer is formed may be immersed in the solution.

Water or an organic solvent is appropriately used as the solvent. The organic solvent is preferably a solvent capable of permeating the patterned plated layer. For example, acetone, methyl acetoacetate, ethyl acetoacetate, ethylene glycol diacetate, cyclohexanone, acetylacetone, acetophenone, 2-(1-cyclohexenyl)cyclohexanone, propylene glycol diacetate, triacetin, diethylene glycol diacetate, dioxane, N-methylpyrrolidone, dimethyl carbonate, or dimethyl cellosolve may be used.

The concentration of the plating catalyst or the precursor thereof in the solution is not particularly limited, but it is preferably 0.001% to 50% by mass and more preferably 0.005% to 30% by mass.

The contact time is preferably about 30 seconds to 24 hours and more preferably about 1 minute to 1 hour.

The adsorbed amount of the plating catalyst or the precursor thereof of the patterned plated layer varies depending on a plating bath species to be used, a catalyst metal species, an interactive group species of a patterned plated layer, usage and the like, but it is preferably 5 to 1,000 mg/m$^2$, more preferably 10 to 800 mg/m$^2$, and still more preferably 20 to 600 mg/m$^2$ from the viewpoint of deposition property of plating.

(Step 3-2: Plating Treatment Step)

Next, a plating treatment is carried out on the patterned plated layer to which a plating catalyst or a precursor thereof has been applied.

The method of a plating treatment is not particularly limited, and examples thereof include an electroless plating treatment and an electrolytic plating treatment (electroplating treatment). In the present step, an electroless plating treatment may be carried out alone, or an electrolytic plating treatment may be further carried out following an electroless plating treatment.

In the present specification, a so-called silver mirror reaction is included as one type of the above-mentioned electroless plating treatment. Thus, a desired patterned metal layer may be formed by reducing the adhered metal ions, for example, by a silver mirror reaction or the like, and thereafter an electrolytic plating treatment may be further carried out.

Hereinafter, the procedure of the electroless plating treatment and electrolytic plating treatment will be described in detail.

The electroless plating treatment refers to an operation of allowing metals to be deposited through a chemical reaction using a solution in which metal ions expected to be deposited as plating are dissolved.

The electroless plating treatment in the present step is carried out, for example, by washing the substrate including the patterned plated layer to which metal ions have been applied with water to remove extra metal ions, and then immersing the substrate in an electroless plating bath. A known electroless plating bath can be used as the electroless plating bath to be used. In addition, metal ions are reduced and then electroless plating is carried out in the electroless plating bath.

Separately from the aspect of using the above-mentioned electroless plating liquid, the reduction of metal ions in the patterned plated layer can be performed by preparing a catalyst activating liquid (reducing liquid) as a separate step before the electroless plating treatment. The catalyst activating liquid is a liquid in which a reducing agent capable of reducing a metal ion into a zero-valent metal is dissolved, and the concentration of the reducing agent with respect to the entire liquid is preferably 0.1% to 50% by mass and more preferably 1% to 30% by mass. As the reducing agent, a boron-based reducing agent such as sodium borohydride or dimethylamine borane, formaldehyde, or hypophosphorous acid can be used.

During the immersion, it is preferred that the substrate is immersed while stirring or shaking.

Typically, the composition of the electroless plating bath mainly includes 1. metal ions for plating, 2. reducing agent, and 3. additive (stabilizer) that improves the stability of metal ions in addition to a solvent (for example, water). In addition to these, the plating bath may include a known additive such as a stabilizer for a plating bath.

The organic solvent used for the electroless plating bath is required to be a solvent which is soluble in water. From this viewpoint, ketones such as acetone; and alcohols such as methanol, ethanol, and isopropanol are preferable. As the type of metal used for the electroless plating bath, copper, tin, lead, nickel, gold, silver, palladium, or rhodium is known. Among them, from the viewpoint of conductivity, copper, silver, or gold is preferable and copper is more preferable. Further, an optimal reducing agent and an optimal additive are selected according to the metal.

The immersion time in the electroless plating bath is preferably 1 minute to 6 hours and more preferably 1 minute to 3 hours.

The electrolytic plating treatment refers to an operation of allowing metals to be deposited by an electric current using a solution in which metal ions expected to be deposited as plating are dissolved.

Further, in the present step as described above, the electrolytic plating treatment may be carried out as necessary, after the electroless plating treatment. According to such an aspect, the thickness of the patterned metal layer to be formed can be suitably adjusted.

As the method of electrolytic plating, a conventional known method can be used. Further, examples of metals used for electrolytic plating include copper, chromium, lead, nickel, gold, silver, tin, and zinc. Among them, from the viewpoint of conductivity, copper, gold, or silver is preferable and copper is more preferable.

In addition, the film thickness of the metal layer obtained by the electrolytic plating can be controlled by adjusting the concentration of a metal contained in the plating bath or the current density.

As shown in FIGS. 3 and 4, the electroconductive laminate 30 obtained according to the first embodiment includes a three-dimensional substrate 11 having a hemispherical shape, a patterned plated layer 13 on one surface of the three-dimensional substrate 11, and a patterned metal layer 14 disposed on the patterned plated layer 13, respectively.

The electroconductive laminate 30 can be applied to various uses as described later, but it can be applied to, for example, a touch sensor. In the case where the electroconductive laminate 30 is applied to a touch sensor, the patterned metal layer 14 can function as a so-called sensor electrode, and a lead-out wiring (not shown) may be electrically connected to the end portions of the patterned metal layer 14 as necessary.

The thickness of the metal layer to be formed by the above-mentioned procedures is not particularly limited and the optimal thickness can be suitably selected according to the intended use, but it is preferably 0.1 µm or greater, more preferably 0.5 µm or greater, and still more preferably 1 to 30 µm, from the viewpoint of conductive properties.

Moreover, the type of metal constituting the metal layer is not particularly limited and examples thereof include copper, chromium, lead, nickel, gold, silver, tin, and zinc.

Among them, from the viewpoint of conductivity, copper, gold, or silver is preferable and copper or silver is more preferable.

The pattern shape of the metal layer is not particularly limited, but the metal layer may have, for example, a mesh pattern because the metal layer is disposed on the patterned plated layer, so that the shape thereof is adjusted by the pattern shape of the patterned plated layer. The metal layer having a mesh pattern can be suitably applied as a sensor electrode in a touch panel. In the case where the pattern shape of the metal layer is a mesh pattern, the range of the length W of one side of the lattice (opening portion) in the mesh pattern, the suitable aspect of the lattice shape, and the line width of the metal layer are the same as in the above-mentioned aspect of a patterned plated layer.

In the first embodiment, the exposure treatment has been described as a method for forming the patterned plated layer, but the present invention is not limited to this aspect, and other energy application methods such as heat treatment may be adopted.

First Modified Example of First Embodiment

Hereinafter, a first modified example of the first embodiment of the method for producing an electroconductive laminate of the present invention will be described in detail.

In the first embodiment, the form in which the metal layer is disposed only on one surface of the three-dimensional substrate has been described, but the present invention is not limited to this form, and the metal layer may be disposed on both surfaces of the three-dimensional substrate.

In other words, the first modified example of the first embodiment of the method for producing an electroconductive laminate has a step of forming a plated-layer precursor layer on both principal surfaces of the three-dimensional substrate to obtain a substrate with a plated-layer precursor layer; a step of applying energy to the plated-layer precursor layer to form a patterned plated layer; and a step of carrying out a plating treatment to form a patterned metal layer on the patterned plated layer.

Hereinafter, each step of the first modified example of the first embodiment will be described in detail. In the first modified example of the first embodiment, the procedure of each step and the material to be used are the same as those in the first embodiment, except that the step of forming the patterned plated layer on both principal surfaces of the three-dimensional substrate is included.

Figure 10:
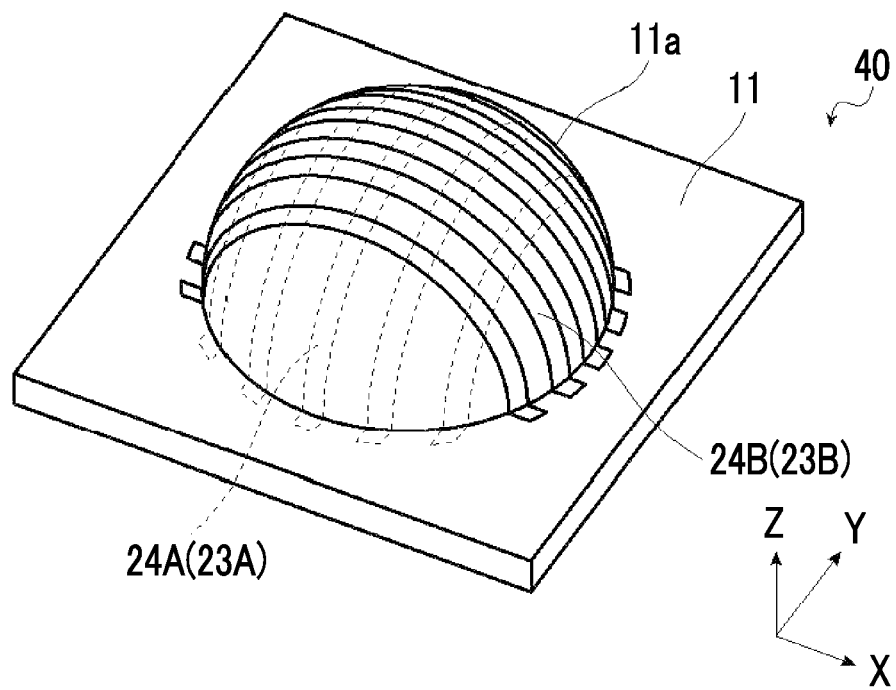
FIG. 10 is a schematic diagram for explaining a first modified example of the first embodiment of the method for producing an electroconductive laminate of the present invention, and is a perspective view of an electroconductive laminate 40.
Figure 11:
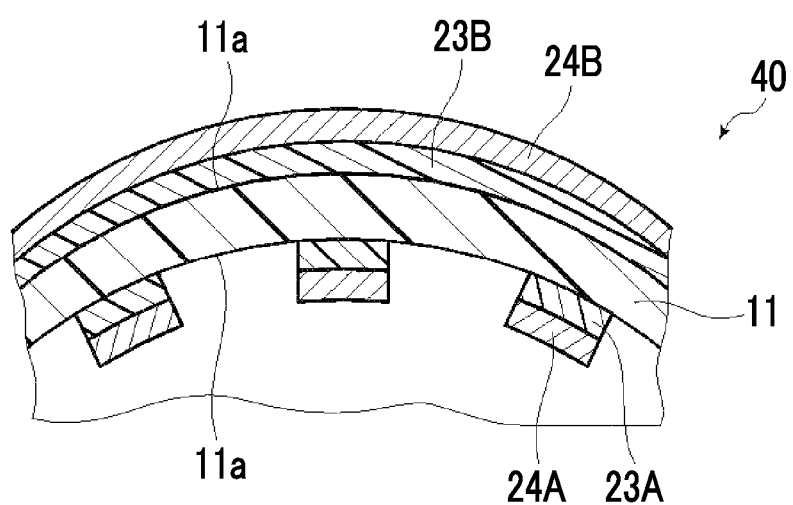
FIG. 11 is a schematic diagram for explaining the first modified example of the first embodiment of the method for producing an electroconductive laminate of the present invention, and is a partial cross-sectional view of the electroconductive laminate 40.

FIG. 10 is a perspective view of an electroconductive laminate 40 having metal layers on both principal surfaces of a three-dimensional substrate, and FIG. 11 is a partial cross-sectional view thereof.

In the electroconductive laminate 40, a metal layer 24A is a layer extending in a first direction (Y direction) and disposed at a predetermined interval in a second direction (X direction) orthogonal to the first direction, and a metal layer 24B is a layer extending in the second direction (X direction) and disposed at a predetermined interval in the first direction (Y direction) orthogonal to the second direction.

In other words, in the step of forming a patterned plated layer on both principal surfaces of the three-dimensional substrate, the coating film of the plated-layer precursor layer formed on the three-dimensional substrate is exposed and developed to form the patterned plated layers (23A and 23B) are formed at positions where the metal layers 24A and 24B can be disposed.

In the case where the electroconductive laminate 40 shown in FIGS. 9 and 10 is applied to a touch sensor, the metal layer 24A and the metal layer 24B function as a first sensor electrode extending in the first direction of the touch sensor and a second sensor electrode extending in the second direction of the touch sensor, respectively.

Second Embodiment

Hereinafter, a second embodiment of the method for producing an electroconductive laminate of the present invention will be described in detail.

In the first embodiment, a form using a hemispherical three-dimensional substrate has been described, but the present invention is not limited to this form.

Figure 12:
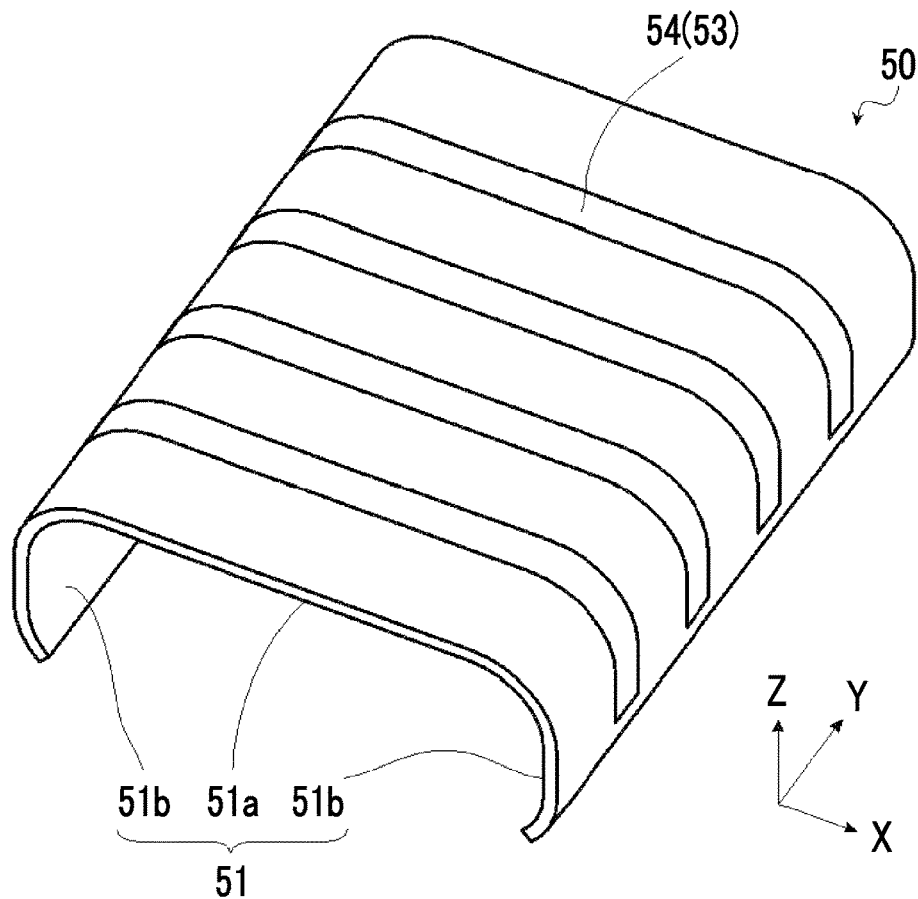
FIG. 12 is a schematic diagram for explaining a second embodiment of a method for producing an electroconductive laminate of the present invention, and is a perspective view of an electroconductive laminate 50.
Figure 13:
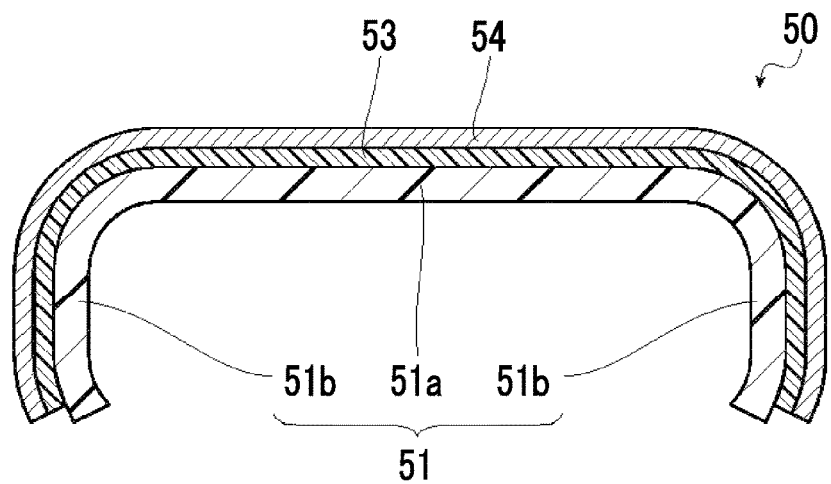
FIG. 13 is a schematic diagram for explaining the second embodiment of a method for producing an electroconductive laminate of the present invention, and is a partial cross-sectional view of an electroconductive laminate 50.

For example, as shown in FIGS. 12 and 13, an electroconductive laminate 50 may be obtained, for example, using a three-dimensional substrate 51 having a flat portion 51a and curved portions 51b including curved surfaces that are continuous with the flat portion 51a and disposed at both ends thereof. In other words, the electroconductive laminate 50 of the second embodiment has a configuration which is different from the electroconductive laminate 30 of the first embodiment only in the shape of the three-dimensional substrate.

The electroconductive laminate 50 is a layer extending in a first direction (X direction) and disposed at a predetermined interval in a second direction (Y direction) orthogonal to the first direction, in the drawing on one surface of the three-dimensional substrate 51, and has a patterned plated layer 53 and a metal layer 54 disposed on the patterned plated layer 53.

[Applications]

The electroconductive laminate of the present invention can be applied to various uses and can be applied to various applications such as a touch panel (or a touch panel sensor), a touch pad (or a touch pad sensor), a semiconductor chip, various electric wiring boards, a flexible printed circuit (FPC), a chip on film (COF), a tape automated bonding (TAB), an antenna, a multilayer wiring board, and a mother board. Among them, it is preferable to use the electroconductive laminate of the present invention as a touch sensor (a capacitive touch sensor such as a touch panel sensor or a touch pad sensor). In the case where the electroconductive laminate is applied to a touch sensor, the patterned metal layer in the electroconductive laminate functions as a detection electrode or a lead-out wiring in the touch sensor.

In the present specification, the touch panel is intended to refer to a combination of various display devices (for example, a liquid crystal display device and an organic electroluminescence (EL) display device), and the touch pad is intended to refer to a device such as a mouse pad not including a display device.

Further, the electroconductive laminate of the present invention can be used as a heat generating member. That is, in the case where an electric current is passed through the patterned metal layer, the temperature of the patterned metal layer rises and the patterned metal layer functions as a heating wire. As a result, the electroconductive laminate itself functions as a heating element. As a more specific application, the conductive laminate of the present invention can also be applied to applications such as on-vehicle headlights and rear glasses. In that case, the patterned metal layer in the electroconductive laminate functions as a heating wire in the headlight and the rear glass.

[Three-Dimensional Structure]

The three-dimensional structure of the present invention is a three-dimensional structure used as a support of a plated-layer precursor layer in the case of exposing the plated-layer precursor layer containing a polymerization initiator and having a functional group capable of interacting with a plating catalyst or a precursor thereof, and a polymerizable group in a patternwise manner to form a patterned plated layer, and preferably contains an ultraviolet absorber. In other words, the three-dimensional structure is used for forming a patterned plated layer and preferably contains an ultraviolet absorber.

In the case where the three-dimensional structure of the present invention contains an ultraviolet absorber, the absorption edge of the ultraviolet-visible absorption spectrum thereof shifts to the longer wavelength side, and is likely to be located on the longer wavelength side than the absorption edge of the ultraviolet-visible absorption spectrum of the polymerization initiator contained in the plated-layer precursor layer. As described above, in the step of forming the patterned plated layer, from the viewpoint of improving the accuracy of the line width of the pattern formed by exposure, it is preferable to control the light absorption characteristics of the polymerization initiator contained in the plated-layer precursor layer and the three-dimensional structure and the wavelength of light to be irradiated. In other words, in the case where the three-dimensional structure of the present invention is used as a support of the plated-layer precursor layer and the exposure is carried out with light at which the polymerization initiator contained in the plated-layer precursor layer is sensitized, it is possible to suppress the reflected light generated by the three-dimensional structure upon exposure of the plated-layer precursor layer, and therefore it is possible to form a pattern having a predetermined line width.

The definition of a three-dimensional structure is the same as that described in the first embodiment, and a suitable embodiment thereof is also the same. The material constituting the three-dimensional structure of the present invention and the ultraviolet absorber are also the same as the material of the three-dimensional substrate and the ultraviolet absorber described in the first embodiment, and preferred embodiments thereof are also the same.

EXAMPLES

Hereinafter, the present invention will be described in more detail with reference to Examples. The materials, the use amounts, the ratios, the treatment contents, the treatment procedures, and the like shown in the following Examples can be appropriately changed without departing from the gist of the present invention. Therefore, the scope of the present invention should not be limitatively interpreted by the following Examples.

<Preparation of Primer Layer Forming Composition 1>

The following components were mixed to prepare a primer layer forming composition 1.

| | |
|---|---|
| Cyclopentanone | 98% by mass |
| Zetpol 0020 (manufactured by Zeon Corporation) | 2% by mass |

<Preparation of Plated Layer Forming Composition 1>

The following components were mixed to prepare a plated layer forming composition 1.

| | |
|---|---|
| 2-Propanol | 84.7% by mass |
| Polyacrylic acid | 9% by mass |
| Acrylamide | 6% by mass |
| IRGACURE OXE02 (manufactured by BASF Corporation) | 0.3% by mass |

The absorption edge on the long wavelength side of the ultraviolet-visible absorption spectrum of the polymerization initiator "IRGACURE OXE02 (manufactured by BASF Corporation)" contained in the plated layer forming composition 1 was 381 nm. The method of determining this absorption edge is as described above.

Example 1

(Production of Three-Dimensional Substrate S1-0)

Figure 14:
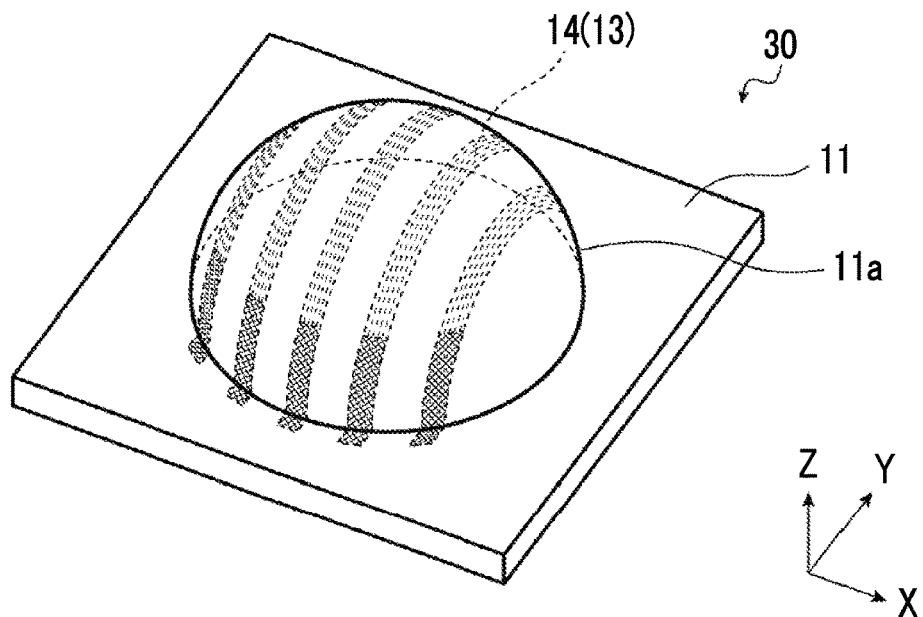
FIG. 14 is a perspective view of a three-dimensional substrate S1-2 with a patterned plated layer produced in Examples and Comparative Examples.

A polycarbonate film (trade name "PANLITE PC-2151", manufactured by Teijin Limited) was melted and then injection-molded to produce a 1000 mm square three-dimensional substrate S1-0 having the shape shown in FIG. 14 and having a hemispherical curved surface with a diameter of 500 mm. The thickness of the substrate was set to 1 mm. The transmittance of the three-dimensional substrate at a wavelength of 400 nm was 80% or more.

(Production of Three-Dimensional Substrate S1-1 with Plated-Layer Precursor Layer)

On the inner surface of the spherical surface of the resulting three-dimensional substrate S1-0, the primer layer forming composition 1 prepared above was spray-coated so that the average dry film thickness was 1 μm to form a primer layer. Subsequently, the plated layer forming composition 1 prepared above was spray-coated on the primer layer so that the average dry film thickness was 0.5 μm, and then the resulting coating film was dried to form a three-dimensional substrate S1-1 with a plated-layer precursor layer.

(Preparation of Photo Mask)

Figure 16:
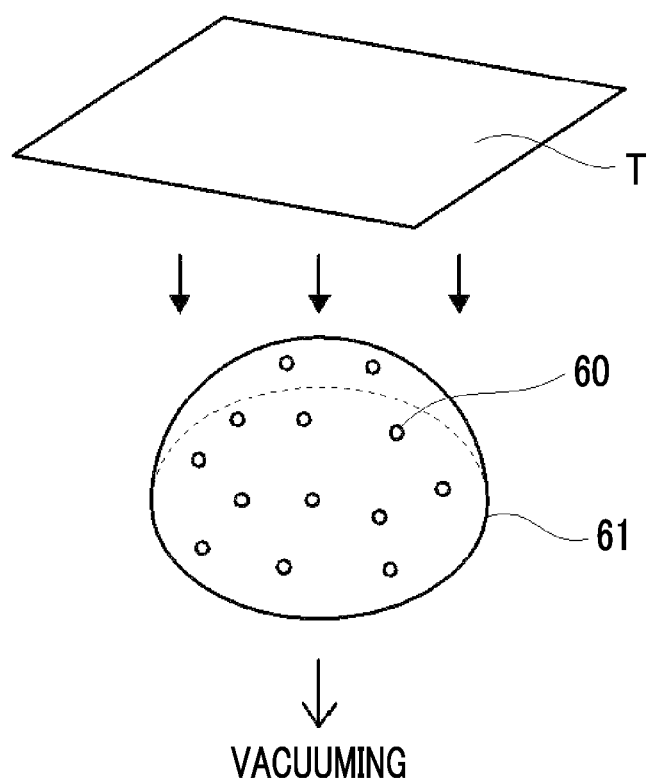
FIG. 16 is a schematic diagram showing a step of producing a photo mask for use in exposure of an electroconductive laminate produced in Examples and Comparative Examples.

A patterned black resist ("CFPR BK", manufactured by Tokyo Ohka Kogyo Co., Ltd.) on a PET film (trade name: "A4300", manufactured by Toyobo Co., Ltd.) was heated to 200° C. Then, as shown in FIG. 16, the heated resin film (T in the drawing) was placed on a jig 61 having substantially the same shape as the three-dimensional substrate S1-0 and having a plurality of through-holes 60, and vacuuming was carried out. The resin film was thermally deformed along the shape of the jig by the above thermal processing to produce a film mask 1 having substantially the same shape as the three-dimensional substrate S1-0, in other words, a three-dimensional shape corresponding to the surface shape of the plated-layer precursor layer disposed on the three-dimensional substrate S1-0.

The film mask 1 has a patterned opening portion capable of giving a pattern shape shown in FIG. 14 described later to the plated-layer precursor layer by exposure (the opening portion corresponds to a region where the black resist is not formed). In addition, the film before thermal deformation has a patterned opening portion so that the opening portion is located at a predetermined position after thermal processing.

(Production of Three-Dimensional Substrate S1-2 with Plated Layer)

The film mask 1 was applied from the inside of the hemisphere of the three-dimensional substrate S1-1 with a plated-layer precursor layer, using the jig, and ultraviolet (UV) irradiation (energy amount: 200 mJ/cm$^2$, wavelength: 365 nm) was applied through the film mask 1. Subsequently, the three-dimensional substrate with a plated-layer precursor layer after exposure was immersed in 1% by mass sodium hydrogen carbonate for 5 minutes and developed to prepare a three-dimensional substrate S1-2 with a patterned plated layer (see FIG. 14). In addition, the area where the patterned plated layer was formed was set to 50 area % or less with respect to the total surface area of the three-dimensional substrate.

Figure 15:
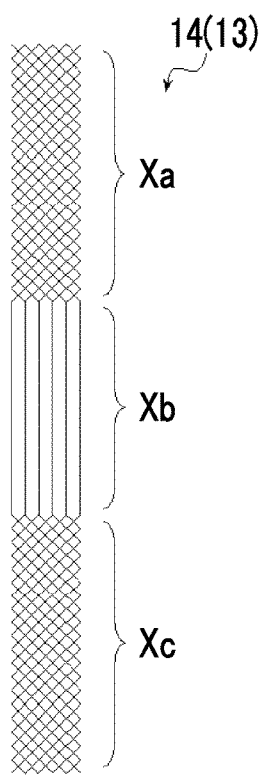
FIG. 15 is a schematic diagram showing a pattern shape of the three-dimensional substrate S1-2 with a patterned plated layer produced in Examples and Comparative Examples.

FIG. 14 is a perspective view of a three-dimensional substrate S1-2 with a patterned plated layer, and FIG. 15 shows the pattern shape thereof.

As shown in FIGS. 14 and 15, the pattern of the plated layer disposed on the three-dimensional substrate S1-2 with a patterned plated layer was configured such a manner that a line-like pattern Xb (LS=5 μm/145 μm) in a region having a large curvature, and the other regions Xa and Xc are as a mesh-like pattern.

The line width of each pattern was 5 mm, and the interval between the patterns was 5 mm.

The length of Xa and Xc in each pattern was 20 mm, and the length of Xb was 35 mm, 45 mm, 50 mm, 45 mm, and 35 mm from the left side of FIG. 14.

(Production of Electroconductive Laminate S1-3)

Subsequently, a three-dimensional substrate with a patterned plated layer was immersed in a 5-fold dilution of only the MAT-2A of the Pd catalyst-applying liquid MAT-2 (manufactured by Uyemura & Co., Ltd.) at room temperature for 5 minutes. Next, the three-dimensional substrate with a patterned plated layer taken out from the above liquid was washed twice with pure water, and then the three-dimensional substrate with a patterned plated layer was immersed in a reducing agent MAB (manufactured by Uyemura & Co., Ltd.) at 36° C. for 5 minutes. Next, the three-dimensional substrate with a patterned plated layer taken out from the reducing agent MAB was washed again twice with pure water. Thereafter, the three-dimensional substrate with a patterned plated layer was immersed in an electroless plating liquid THRU-CUP PEA (manufactured by Uyemura & Co., Ltd.) at room temperature for 60 minutes, and then washed with pure water.

By the above step, a patterned metal layer was formed to obtain an electroconductive laminate S1-3 having a hemispherical curved surface.

Example 2

(Production of Three-Dimensional Substrate S2-0)

The following ultraviolet absorber (1) (trade name: "UVSORB 101", manufactured by Fujifilm Fine Chemicals Co., Ltd.), in which a polycarbonate film (trade name: "PC-2151", manufactured by Teijin Limited) was melted, was added so as to be 2% by mass with respect to the resin component. Subsequently, the obtained composition was injection-molded to produce a 1000 mm square three-dimensional substrate S2-0 having a curved surface of a hemispherical shape with a diameter of 500 mm as shown in FIG. 14. The thickness of the substrate was set to 1 mm. In addition, the transmittance of the three-dimensional substrate at a wavelength of 400 nm was 80% or more.

The position of the absorption edge on the long wavelength side of the ultraviolet-visible absorption spectrum of the three-dimensional substrate S2-0 was 386 nm. The method of determining this absorption edge is as described above.

Ultraviolet Absorber (1)

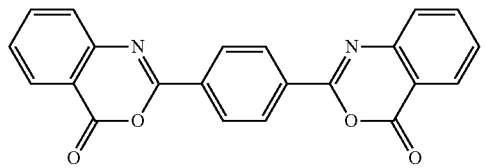 [SMILES: O=c1oc(-c2ccc(-c3nc4ccccc4c(=O)o3)cc2)nc2ccccc12]

(Production of Electroconductive Laminate S2-3)

An electroconductive laminate S2-3 was produced in the same manner as in Example 1, except that the three-dimensional substrate S2-0 was used.

Example 3

(Production of Electroconductive Laminate S3-3)

An electroconductive laminate S3-3 was produced in the same manner as in Example 2, except that the coating method was changed from a spray coating method to a dip coating method.

Comparative Example 1

A primer layer 1 was formed on a 1 mm thick polycarbonate plate and copper was vapor deposited thereon to form a 2 μm thick copper foil. Next, a negative resist was applied to the copper foil surface to a thickness of about 6 μm and dried at 90° C. for 30 minutes. The negative resist was irradiated with ultraviolet light (UV light) at 100 mJ/cm$^2$ through a photo mask. It should be noted that, in order to form a pattern substantially the same as the pattern shape of the patterned plated layer produced in Example 1 on the substrate after a thermal heating step (pipe suction step) to be described later, the photo mask has a slightly larger opening portion than the pattern shape of the patterned plated layer produced in Example 1, at a predetermined position.

Next, the negative resist was developed with an aqueous 3% sodium carbonate solution. As a result, a resist pattern was formed in a portion corresponding to the pattern wiring, and the resist in the other portion was removed. Next, using a ferric chloride solution having a specific gravity of 1.45, the exposed portion of the copper foil was removed by etching, and the remaining resist was peeled off.

Thereafter, the plate was cut into a circular shape of 100 mmϕ and fixed to a frame having an outer diameter of 100 mmϕ and an inner diameter of 90 mmϕ. Immediately after being taken out in an oven at 200° C. for 10 minutes, followed by sucking using a pipe having an outer diameter of 80 mmϕ and an inner diameter of 70 mmϕ, the wiring-formed polycarbonate plate was deformed into a hemispherical shape to obtain an electroconductive laminate SR-3 having a hemispherical shape.

[Evaluation of Conduction of Electroconductive Laminate]

In the case where the conduction of the metal layers of the electroconductive laminates S1-3, S2-3, S3-3, and SR-3 was confirmed, the electroconductive laminates S1-3, S2-3, and S3-3 were conducted, but the electroconductive laminate SR-3 did not conduct. Further, it was confirmed that, in the case where an electric current is allowed to flow, the temperature of the electroconductive laminates S1-3, S2-3, and S3-3 increase and therefore those laminates can be used as electric heating wires.

[Effect of Ultraviolet Absorber]

As a result of comparing S1-3, S2-3, and S3-3, it was found that the wiring width after plating was maximum 20 μm for S1-3, whereas it was maximum 8 μm for S2-3 and S3-3, thus confirming the effect of miniaturization by the ultraviolet absorber. The results are summarized in Table 1.

In Table 1, the "Absorption edge of initiator" represents the position (nm) of the absorption edge on the long wavelength side of the ultraviolet-visible absorption spectrum of the polymerization initiator contained in the plated-layer precursor layer.

Also, in Table 1, the "Absorption edge of three-dimensional substrate" represents the position (nm) of the absorption edge on the long wavelength side of the ultraviolet-visible absorption spectrum of the three-dimensional substrate.

TABLE 1

| | Electro-conductive laminate | Conductivity | Maximum wiring width (μm) | UV absorber of three-dimensional substrate | | Absorption edge of initiator (nm) |
| --- | --- | --- | --- | --- | --- | --- |
| | | | | Added/ not added | Absorption edge of three-dimensional substrate (nm) | |
| Comparative Example 1 | SR-3 | Not having | — | Not added | — | — |
| Example 1 | S1-3 | Having | 20 | Not added | 300 | 381 |
| Example 2 | S2-3 | Having | 8 | Added | 386 | 381 |
| Example 3 | S3-3 | Having | 8 | Added | 386 | 381 |

Example 4

Using the plated layer forming composition 1, an electroconductive laminate was produced according to the procedure of the production method of the present invention. Specifically, a double-sided wiring substrate (electroconductive laminate) S1-4 having a curved surface was produced in the same manner as in Example 1, except that, in Example 1, a patterned plated layer was placed on one surface of a three-dimensional substrate, and then, as shown in FIGS. 10 and 11, a patterned plated layer was disposed so as to be orthogonal to the opposite surface of the three-dimensional substrate.

Example 5

Using the plated layer forming composition 1, an electroconductive laminate was produced according to the procedure of the production method of the present invention. Specifically, a double-sided wiring substrate (electroconductive laminate) S2-4 having a curved surface was produced in the same manner as in Example 2, except that, in Example 2, a patterned plated-layer precursor layer was placed on one surface of a three-dimensional substrate, and then, as shown in FIGS. 10 and 11, a patterned plated layer was disposed so as to be orthogonal to the opposite surface of the three-dimensional substrate.

Example 6

Using the plated layer forming composition 1, an electroconductive laminate was produced according to the procedure of the production method of the present invention. Specifically, a double-sided wiring substrate (electroconductive laminate) S3-4 having a curved surface was produced in the same manner as in Example 3, except that, in Example 3, a patterned plated-layer precursor layer was placed on one surface of a three-dimensional substrate, and then, as shown in FIGS. 10 and 11, a patterned plated layer was disposed so as to be orthogonal to the opposite surface of the three-dimensional substrate.

[Confirmation of Drive as Touch Sensor]

Using the electroconductive laminates S1-4, S2-4, and S3-4, a lead-out wiring was further formed on each electroconductive laminate, and it was confirmed whether or not the electroconductive laminates would react as a touch sensor. As a result, all of the electroconductive laminates reacted as a touch sensor.

EXPLANATION OF REFERENCES

10: three-dimensional substrate with plated-layer precursor layer
20: three-dimensional substrate with patterned plated layer
1, 11, 51: three-dimensional substrate
11*a*: surface of region having three-dimensional shape including curved surface
13, 23A, 23B, 53: patterned plated layer
14, 24A, 24B, 54: metal layer
25: photo mask
2, 12: plated-layer precursor layer
30, 40, 50: electroconductive laminate
31: thin line
32: lattice
W: length of one side of lattice (opening portion)
51*a*: flat portion
51*b*: curved portion
T: resin film
60: through-hole
61: jig
Xb: line-like pattern
Xa, Xc: mesh-like pattern

What is claimed is:

1. A three-dimensional structure with a plated-layer precursor layer, comprising:
a three-dimensional structure; and
a plated-layer precursor layer disposed on the three-dimensional structure and having a functional group capable of interacting with a plating catalyst or a precursor thereof and a polymerizable group,
wherein the plated-layer precursor layer includes a polymerization initiator and Compound X or Composition Y given below,
wherein the transmittance of the three-dimensional structure at a wavelength of 400 nm is 80% or more, and the absorption edge on the long wavelength side of the ultraviolet-visible absorption spectrum of the polymerization initiator contained in the plated-layer precursor layer is located on a shorter wavelength side than the absorption edge on the long wavelength side of the ultraviolet-visible absorption spectrum of the three-dimensional structure, and wherein a wavelength difference therebetween (wavelength (nm) of the absorption edge on the long wavelength side of the ultraviolet-visible absorption spectrum of the three-dimensional structure−wavelength (nm) of the absorption edge on the long wavelength side of the ultraviolet-visible absorption spectrum of the polymerization initiator) is 5 to 150 nm, Compound X: a compound having a functional group capable of interacting with a plating catalyst or a precursor thereof, and a polymerizable group, Composition Y: a composition containing a compound having a functional group capable of interacting with a plating catalyst or a precursor thereof, and a compound having a polymerizable group.

2. A three-dimensional structure with a patterned plated layer, comprising:

a three-dimensional structure; and a patterned plated layer disposed on the three-dimensional structure, wherein the patterned plated layer is a layer obtained by curing a composition containing a polymerization initiator and Compound X or Composition Y given below, Compound X: a compound having a functional group capable of interacting with a plating catalyst or a precursor thereof, and a polymerizable group, Composition Y: a composition containing a compound having a functional group capable of interacting with a plating catalyst or a precursor thereof, and a compound having a polymerizable group, wherein the transmittance of the three-dimensional structure at a wavelength of 400 nm is 80% or more, and the absorption edge on the long wavelength side of the ultraviolet-visible absorption spectrum of the polymerization initiator is located on a shorter wavelength side than the absorption edge on the long wavelength side of the ultraviolet-visible absorption spectrum of the three-dimensional structure, wherein a wavelength difference therebetween (wavelength (nm) of the absorption edge on the long wavelength side of the ultraviolet-visible absorption spectrum of the three-dimensional structure−wavelength (nm) of the absorption edge on the long wavelength side of the ultraviolet-visible absorption spectrum of the polymerization initiator) is 5 to 150 nm, and wherein the three-dimensional structure has a three-dimensional shape which includes curved face.

3. The three-dimensional structure with a patterned plated layer according to claim 2, wherein the region where the patterned plated layer is formed is 50 area % or less with respect to the total surface area of the three-dimensional structure.

4. The three-dimensional structure with a patterned plated layer according to claim 2, wherein the patterned plated layer further includes a plating catalyst or a precursor thereof.

5. The three-dimensional structure with a patterned plated layer according to claim 2, wherein the patterned plated layer has a region in which a line width of the pattern is 20 μm or less.

6. An electroconductive laminate comprising:

the three-dimensional structure with a patterned plated layer according to claim 2; and a metal layer disposed on the patterned plated layer.

7. A touch sensor comprising:

the electroconductive laminate according to claim 6, wherein the metal layer functions as an electrode or wiring.

8. A heat generating member comprising:

the electroconductive laminate according to claim 6, wherein the metal layer functions as a heating wire.

9. The three-dimensional structure with a patterned plated layer according to claim 3, wherein the patterned plated layer further includes a plating catalyst or a precursor thereof.

10. The three-dimensional structure with a patterned plated layer according to claim 3, wherein the patterned plated layer has a region in which a line width of the pattern is 20 μm or less.

11. The three-dimensional structure with a patterned plated layer according to claim 4, wherein the patterned plated layer has a region in which a line width of the pattern is 20 μm or less.

12. The three-dimensional structure with a plated-layer precursor layer according to claim 1, wherein the wavelength difference therebetween (wavelength (nm) of the absorption edge on the long wavelength side of the ultraviolet-visible absorption spectrum of the three-dimensional substrate−wavelength (nm) of the absorption edge on the long wavelength side of the ultraviolet-visible absorption spectrum of the polymerization initiator) is 10 to 150 nm.

* * * * *